US012757392B2

(12) United States Patent
Yuda et al.

(10) Patent No.: US 12,757,392 B2
(45) Date of Patent: Oct. 6, 2026

(54) THREE-DIMENSIONAL MEMORY DEVICE INCLUDING DIPOLE-CONTAINING BLOCKING DIELECTRIC LAYER AND METHODS FOR FORMING THE SAME

(71) Applicant: SANDISK TECHNOLOGIES LLC, Addison, TX (US)

(72) Inventors: Takashi Yuda, Yokkaichi (JP); Noriyuki Nagahata, Yokkaichi (JP); Ippei Yasuda, Yokkaichi (JP)

(73) Assignee: Sandisk Technologies, Inc., Milpitas, CA (US)

(*) Notice: Subject to any disclaimer, the term of this patent is extended or adjusted under 35 U.S.C. 154(b) by 929 days.

(21) Appl. No.: 17/823,639

(22) Filed: Aug. 31, 2022

(65) Prior Publication Data

US 2024/0074170 A1 Feb. 29, 2024

(51) Int. Cl.
*H10B 43/27* (2023.01)
*H10B 41/10* (2023.01)
(Continued)

(52) U.S. Cl.
CPC ............. *H10B 41/27* (2023.02); *H10B 41/10* (2023.02); *H10B 41/35* (2023.02); *H10B 43/10* (2023.02); *H10B 43/27* (2023.02); *H10B 43/35* (2023.02)

(58) Field of Classification Search
CPC ........ H10B 41/27; H10B 41/20; H10B 41/30; H10B 41/35; H10B 43/27; H10B 43/30; H10B 43/35; H10B 43/20; H10B 43/23; H10B 41/23; H10B 41/10; H10B 43/10; H10B 43/50; H10D 64/037
See application file for complete search history.

(56) References Cited

U.S. PATENT DOCUMENTS 10,516,025 B1 12/2019 Nishikawa et al.
10,720,444 B2 7/2020 Nishikawa et al.
(Continued)

OTHER PUBLICATIONS

C.-H. Huang et al. Solid-State Electronics 53 (2009) 279-284 (Year: 2009) (Year: 2009).*
(Continued)

*Primary Examiner* — Matthew C Landau
*Assistant Examiner* — Vincent Kipkemoi Rono
(74) *Attorney, Agent, or Firm* — THE MARBUY LAW LAW GROUP PLLC

(57) ABSTRACT

A memory device includes an alternating stack of insulating layers and electrically conductive layers arranged along a vertical direction, a memory opening vertically extending through the alternating stack, and a memory opening fill structure located in the memory opening and including a vertical semiconductor channel and a memory film. The memory film includes a blocking dielectric film, a tunneling dielectric layer and a vertical stack of memory elements located between the blocking dielectric film and the tunneling dielectric layer. The blocking dielectric film includes component layers which include, from a side that is proximal to the vertical stack of memory elements toward a side that is distal from the vertical stack of memory elements, an inner silicon oxide blocking dielectric layer, a middle dielectric metal oxide blocking dielectric layer, an outer silicon oxide blocking dielectric layer, and an outer dielectric metal oxide blocking dielectric layer.

9 Claims, 24 Drawing Sheets

(51) Int. Cl.

| | |
|---|---|
| ***H10B 41/27*** | (2023.01) |
| ***H10B 41/35*** | (2023.01) |
| ***H10B 43/10*** | (2023.01) |
| ***H10B 43/35*** | (2023.01) |

(56) References Cited

U.S. PATENT DOCUMENTS

| | | | | |
|---|---|---|---|---|
| 10,804,282 | B2 | 10/2020 | Baraskar et al. | |
| 2018/0040627 | A1* | 2/2018 | Kanakamedala ...... | H10B 43/27 |
| 2019/0304986 | A1* | 10/2019 | Dong ..................... | H10B 51/20 |
| 2019/0386108 | A1 | 12/2019 | Nishikawa et al. | |
| 2020/0051993 | A1 | 2/2020 | Rabkin et al. | |
| 2020/0058672 | A1 | 2/2020 | Nishikawa et al. | |
| 2020/0227439 | A1* | 7/2020 | Sato ....................... | H10B 51/20 |
| 2020/0279866 | A1* | 9/2020 | Nishikawa ........... | H10D 64/037 |
| 2020/0295039 | A1 | 9/2020 | Rabkin et al. | |
| 2022/0109003 | A1 | 4/2022 | Nagahata et al. | |

OTHER PUBLICATIONS

Endoh et al., "Novel Ultra High-Density Memory with a Stacked-Surrounding Gate Transistor (S-SGT) Structured Cell," IEDM Proc. (2001) 33-36.

* cited by examiner

THREE-DIMENSIONAL MEMORY DEVICE INCLUDING DIPOLE-CONTAINING BLOCKING DIELECTRIC LAYER AND METHODS FOR FORMING THE SAME

FIELD

The present disclosure relates generally to the field of semiconductor devices, and particularly to a three-dimensional memory device including dipole-containing blocking dielectric layers and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a memory device includes an alternating stack of insulating layers and electrically conductive layers arranged along a vertical direction, a memory opening vertically extending through the alternating stack, and a memory opening fill structure located in the memory opening and including a vertical semiconductor channel and a memory film. The memory film includes a blocking dielectric film, a tunneling dielectric layer and a vertical stack of memory elements located between the blocking dielectric film and the tunneling dielectric layer. The blocking dielectric film includes component layers which include, from a side that is proximal to the vertical stack of memory elements toward a side that is distal from the vertical stack of memory elements, an inner silicon oxide blocking dielectric layer, a middle dielectric metal oxide blocking dielectric layer, an outer silicon oxide blocking dielectric layer, and an outer dielectric metal oxide blocking dielectric layer.

According to another aspect of the present disclosure, a method of forming a memory device comprises forming an alternating stack of insulating layers and sacrificial material layers over a substrate, forming a memory opening through the alternating stack, forming a memory opening fill structure in the memory opening, wherein the memory opening fill structure comprises a vertical semiconductor channel and a memory film, forming backside recesses by removing the sacrificial material layers selective to the insulating layers and the memory opening fill structure, and forming electrically conductive layers in the backside recesses. The memory film comprises a blocking dielectric film, a tunneling dielectric layer and a vertical stack of memory elements located between the blocking dielectric film and the tunneling dielectric layer. The blocking dielectric film comprises component layers which comprise, from a side that is proximal to the vertical stack of memory elements toward a side that is distal from the vertical stack of memory elements, an inner silicon oxide blocking dielectric layer, a middle dielectric metal oxide blocking dielectric layer, an outer silicon oxide blocking dielectric layer, and an outer dielectric metal oxide blocking dielectric layer.

DETAILED DESCRIPTION

Figure 1A:
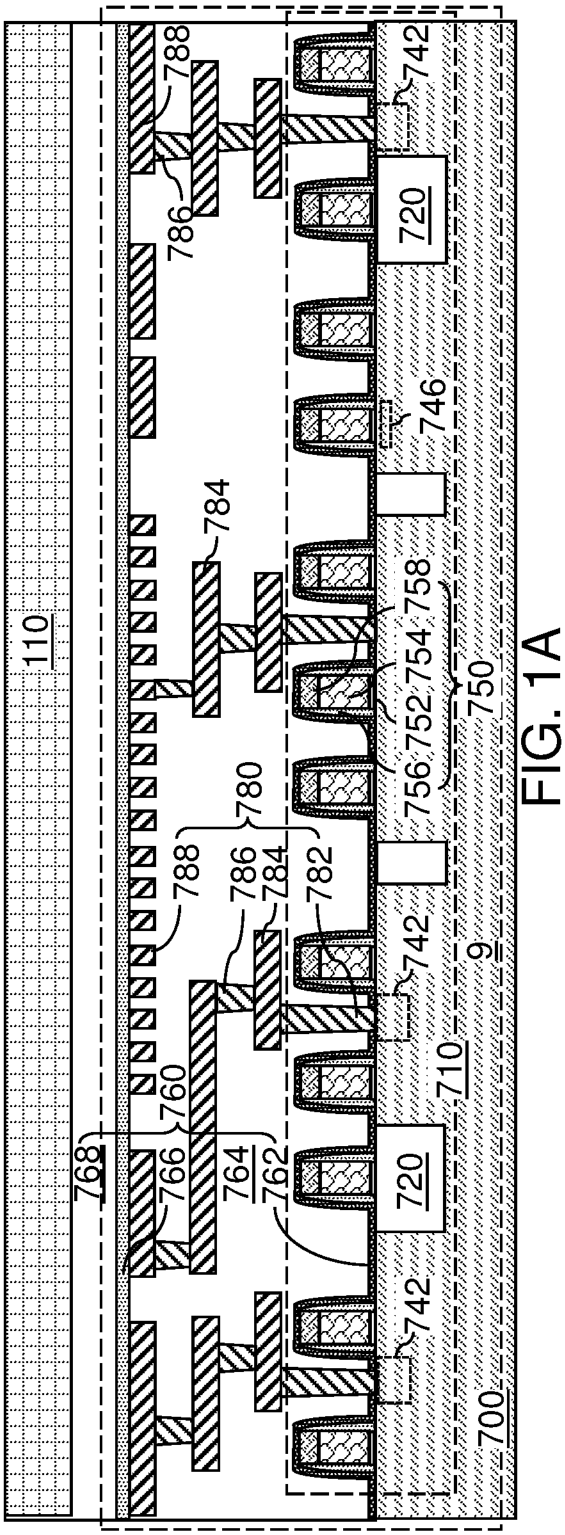
FIG. 1A is a vertical cross-sectional view of an exemplary structure after formation of semiconductor devices, lower level dielectric layers, and lower metal interconnect structures, on a semiconductor substrate according to an embodiment of the present disclosure.

As discussed above, the present disclosure is directed to a three-dimensional memory device including dipole-containing blocking dielectric layers and methods of manufacturing the same, the various aspects of which are described below.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, an element located "on" a second element can be located on the exterior side of a surface of the second element or on the interior side of the second element. As used herein, an element is located "directly on" a second element if there exist a physical contact between a surface of the element and a surface of the second element. As used herein, a "prototype" structure or an "in-process" structure refers to a transient structure that is subsequently modified in the shape or composition of at least one component therein. As used herein, an electrical component is electrically connected to a second electrical component if there exists an electrically conductive path between the electrical component and the second electrical component.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulator material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many external commands as the total number of dies therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. Each plane contains a number of memory blocks (or "blocks"), which are the smallest unit that can be erased by in a single erase operation. Each memory block contains a number of pages, which are the smallest units that can be selected for programming.

Referring to FIG. 1A, an exemplary structure according to an embodiment of the present disclosure is illustrated. The exemplary structure includes a substrate 9, such as a silicon wafer, and semiconductor devices 710 formed thereupon. Shallow trench isolation structures 720 may be formed in an upper portion of the substrate 9 to provide electrical isolation from other semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring to and from the various nodes of the semiconductor devices and landing pads for through-memory-level contact via structures to be subsequently formed. The lower-level metal interconnect structures 780 are formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one second dielectric material layer 768 may comprise, or consist essentially of, dielectric material layers having dielectric constants that do not exceed the dielectric constant of undoped silicate glass (silicon oxide) of 3.9.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly.

Figure 1B:
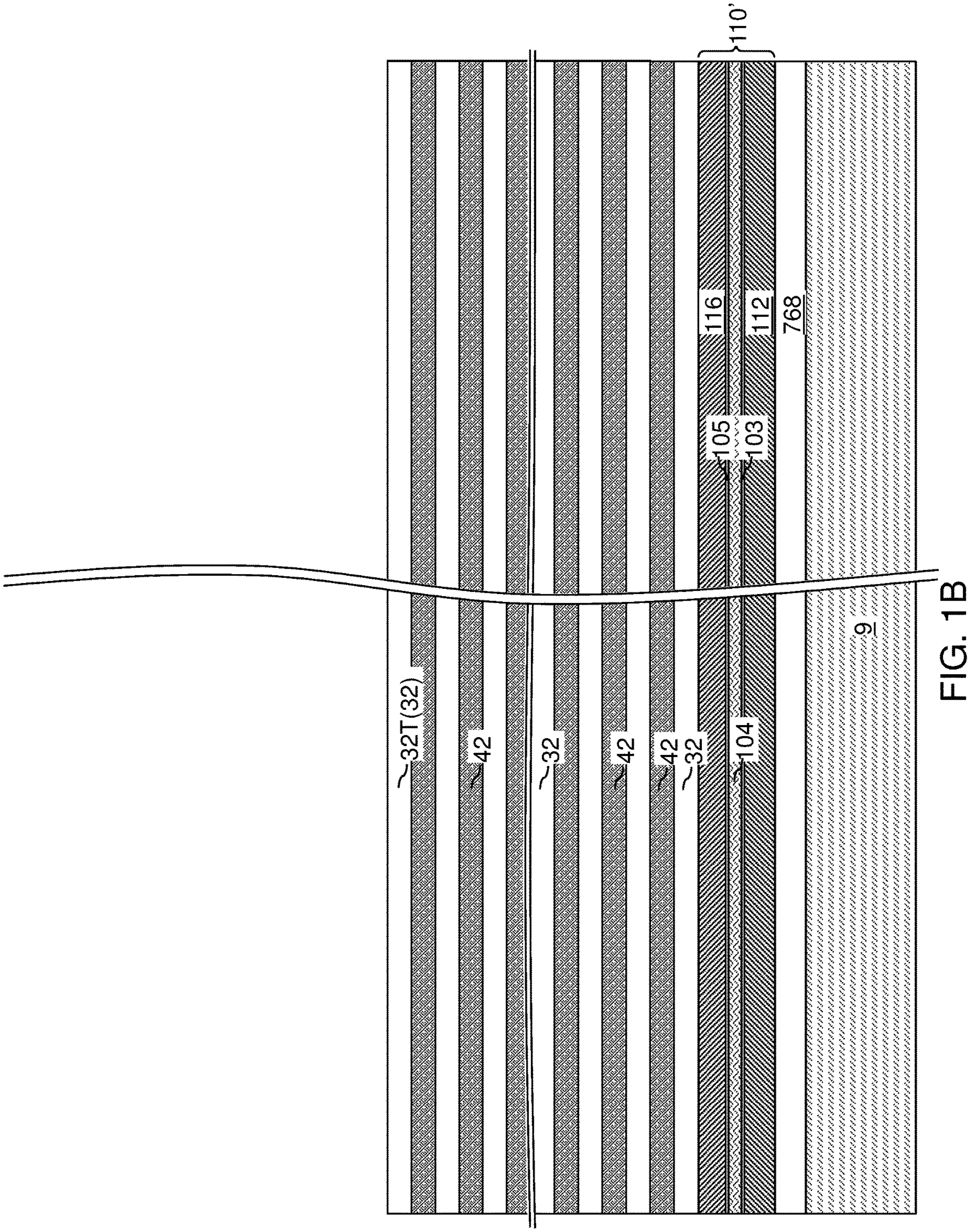
FIG. 1B is a vertical cross-sectional view of an exemplary structure after formation of in-process source level material layers.

Referring to FIG. 1B, the in-process source-level material layers 110' are formed over the lower-level dielectric material layers 760 and may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a source-level semiconductor layer 112 including a doped semiconductor material, a source-level dielectric layer 103, a source-level sacrificial layer 104 including a source-level sacrificial material, a second source-level dielectric layer 105, and the second source-level semiconductor layer 116 including a doped semiconductor material.

The doped semiconductor material of the second source-level semiconductor layer 116 may be the same as, or may be different from, the doped semiconductor material of the source-level semiconductor layer 112. For example, the doped semiconductor material may comprise heavily doped polysilicon. Each of the source-level semiconductor layer 112 and the second source-level semiconductor layer 116 may have a thickness in a range from 100 nm to 1,000 nm, although lesser and greater thicknesses may also be employed.

The source-level dielectric layer 103 and the second source-level dielectric layer 105 comprises a dielectric material, such as silicon oxide. Each of the source-level dielectric layer 103 and the second source-level dielectric layer 105 may have a thickness in a range from 5 nm to 200 nm, although lesser and greater thicknesses may also be employed.

The source-level sacrificial material of the source-level sacrificial layer 104 comprises a material that may be removed selective to the doped semiconductor materials of the source-level semiconductor layer 112 and the second source-level semiconductor layer 116. The source-level sacrificial material of the source-level sacrificial layer 104 may comprise silicon nitride, a silicon-germanium alloy, undoped amorphous silicon, undoped polysilicon, organosilicate glass, or any other material that may be subsequently removed selective to the materials of the source-level semiconductor layer 112 and the second source-level semiconductor layer 116. The thickness of the source-level sacrificial layer 104 may be in a range from 50 nm to 600 nm, such as from 100 nm to 300 nm, although lesser and greater thicknesses may also be employed.

A stack of an alternating plurality of insulating layers 32 and sacrificial material layer 42 is formed over the top surface of the in-process source-level material layers 110'. As used herein, a "material layer" refers to a layer including a material throughout the entirety thereof. As used herein, an alternating plurality of elements and second elements refers to a structure in which instances of the elements and instances of the second elements alternate. Each instance of the elements that is not an end element of the alternating plurality is adjoined by two instances of the second elements on both sides, and each instance of the second elements that is not an end element of the alternating plurality is adjoined by two instances of the elements on both ends. The elements may have the same thickness thereamongst, or may have different thicknesses. The second elements may have the same thickness thereamongst, or may have different thicknesses. An alternating plurality of first material layers and second material layers may begin with an instance of the first material layers or with an instance of the second material layers, and may end with an instance of the first material layers or with an instance of the second material layers. In one embodiment, an instance of the elements and an instance of the second elements may form a unit that is repeated with periodicity within the alternating plurality.

The stack of the alternating plurality of insulating layers 32 and sacrificial material layer 42 is herein referred to as an alternating stack (32, 42). In one embodiment, each insulating layer 32 may consist essentially of an insulating material. Insulating materials that can be used for the insulating layers 32 include, but are not limited to, silicon oxide (including doped or undoped silicate glass), organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the material of the insulating layers 32 can be silicon oxide.

The sacrificial material layers 42 may comprise an insulating material, a semiconductor material, or a conductive material. The second material of the sacrificial material layers 42 can be subsequently replaced with electrically conductive layers which can function, for example, as control gate electrodes/word lines of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers 42 can include silicon nitride sacrificial material layers. The first material of the insulating layers 32 can be deposited, for example, by chemical vapor deposition (CVD). For example, if silicon oxide is used for the insulating layers 32, tetraethyl orthosilicate (TEOS) can be used as the precursor material for the CVD process. The second material of the sacrificial material layers 42 can be formed, for example, CVD or atomic layer deposition (ALD).

The topmost layer of the alternating stack (32, 42) may be an insulating layer 32, which is hereafter referred to as a topmost insulating layer 32T. The thicknesses of the insulating layers 32 and the sacrificial material layers 42 can be in a range from 20 nm to 50 nm, although lesser and greater thicknesses can be used for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be used. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Figure 2:
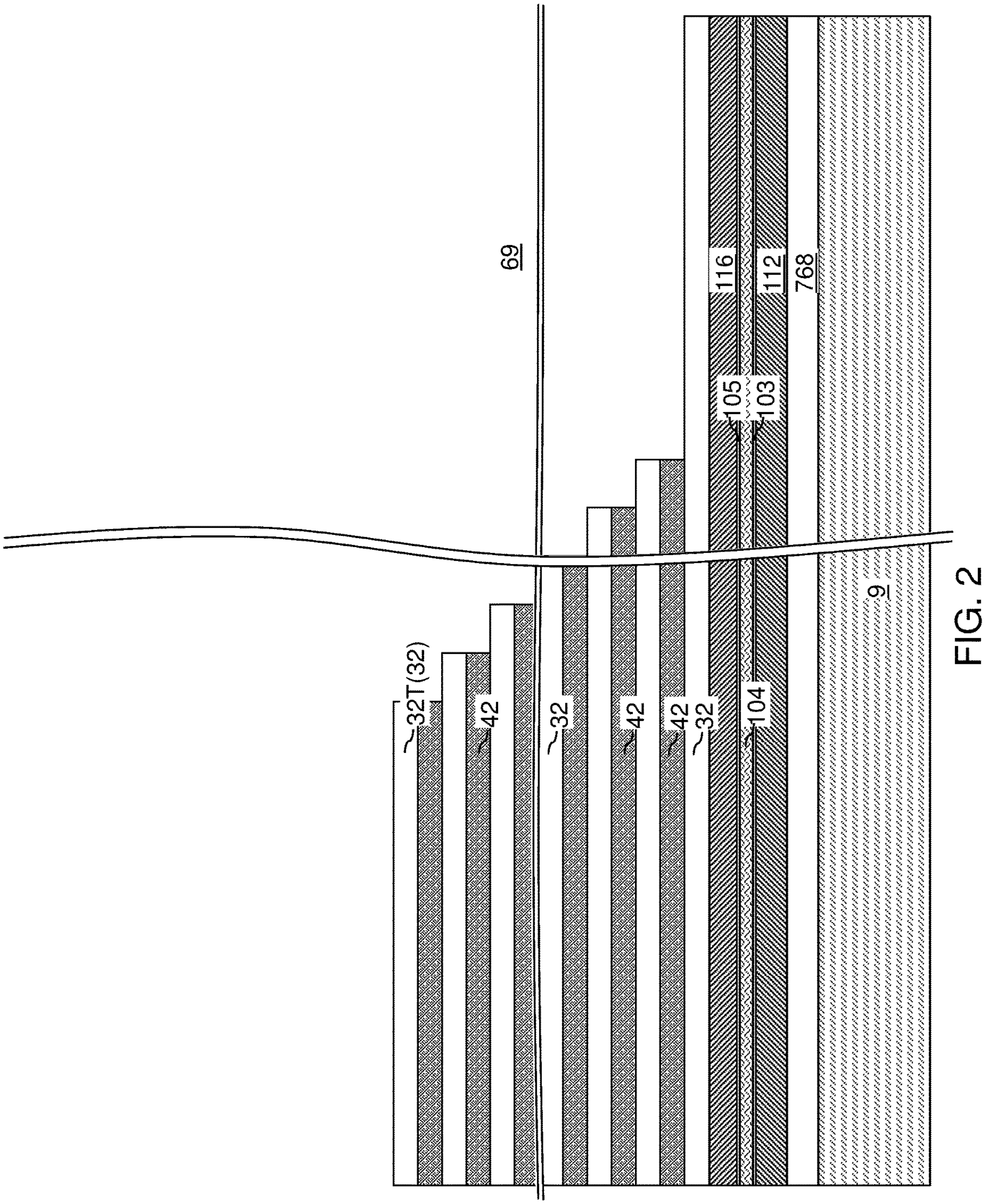
FIG. 2 is a schematic vertical cross-sectional view of the exemplary structure after formation of stepped surfaces according to an embodiment of the present disclosure.

Referring to FIG. 2, stepped surfaces are optionally formed by patterning the alternating stack (32, 42). The region including the stepped surfaces is herein referred to as a terrace region. As used herein, "stepped surfaces" refer to a set of surfaces that include at least two horizontal surfaces and at least two vertical surfaces such that each horizontal surface is adjoined to a first vertical surface that extends upward from an edge of the horizontal surface, and is adjoined to a second vertical surface that extends downward from a second edge of the horizontal surface. An optional stepped cavity 69 is formed within the volume from which portions of the alternating stack (32, 42) are removed through formation of the stepped surfaces. A "stepped cavity" refers to a cavity having stepped surfaces.

The stepped cavity 69 can have various stepped surfaces such that the horizontal cross-sectional shape of the stepped cavity changes in steps as a function of the vertical distance from the bottom surface of the buffer dielectric layer 111. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

In one embodiment, all layers of the alternating stack (32, 42) other than the bottommost insulating layer 32 may be patterned to provide stepped surfaces. In this case, each layer of the alternating stack (32, 42) other than the bottommost insulating layer 32 may have a respective physically exposed sidewall that is exposed to the stepped cavity 69. In one embodiment, each physically exposed sidewall of a sacrificial material layer 42 may be vertically coincident with a physically exposed sidewall of a respective overlying or underlying insulating material layer 32. Upon formation of the stepped surfaces, lateral extents of the sacrificial material layers 42 decrease with a vertical distance from the in-process a source-level material layers (112, 103, 104, 105, 116).

Figure 3:
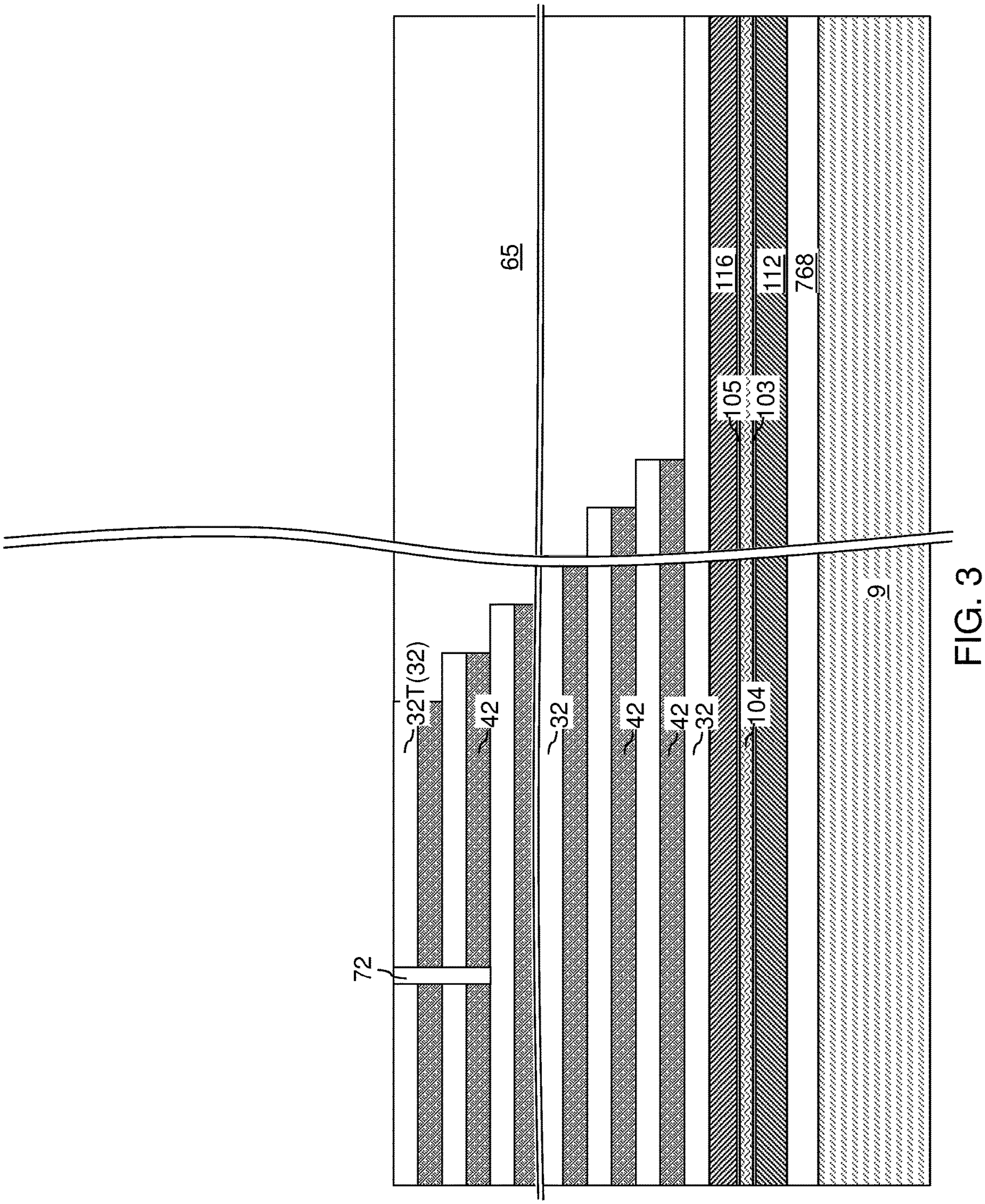
FIG. 3 is a schematic vertical cross-sectional view of the exemplary structure after formation of patterned plates, a stepped dielectric material portion, and drain-select-level isolation structures according to an embodiment of the present disclosure.

Referring to FIG. 3, if the stepped cavity 69 is formed, then a stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost insulating layer 32T, for example, by chemical mechanical planarization (CMP). The remaining portion of the deposited dielectric material filling the stepped cavity constitutes the stepped dielectric material portion 65. As used herein, a "stepped" element refers to an element that has stepped surfaces and a horizontal cross-sectional area that increases monotonically as a function of a vertical distance from a top surface of a substrate on which the element is present. If silicon oxide is used for the stepped dielectric material portion 65, the silicon oxide of the stepped dielectric material portion 65 may, or may not, be doped with dopants such as B, P, and/or F. In one embodiment, the stepped dielectric material portion 65 has a stepwise-increasing lateral extent that increases with a vertical distance from the substrate 9.

The stepped dielectric material portion 65 contacts sidewalls of the insulating layers 32 of the alternating stack (32, 42). In one embodiment, the stepped dielectric material portion 65 contacts stepped surfaces of the alternating stack (32, 42), and has a variable lateral extent that increases with a vertical distance from a horizontal plane including an interface between the alternating stack (32, 42) and the in-process source-level material layers (112, 103, 104, 105, 116).

Optionally, drain-select-level isolation structures 72 can be formed through the topmost insulating layer 32T and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the topmost insulating layer 32T.

Figure 4A:
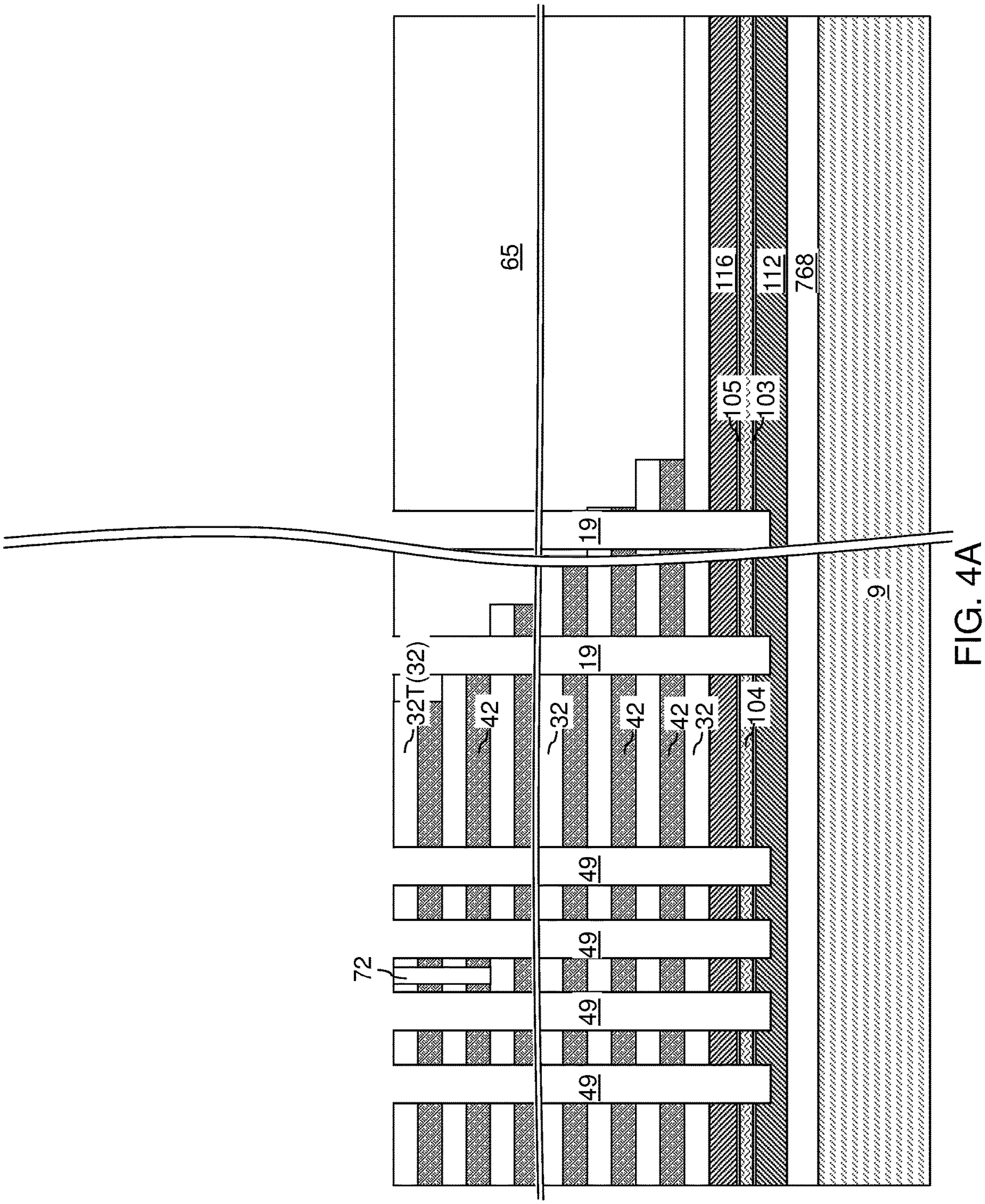
FIG. 4A is a schematic vertical cross-sectional view of the exemplary structure after formation of memory openings and support openings according to an embodiment of the present disclosure.
Figure 4B:
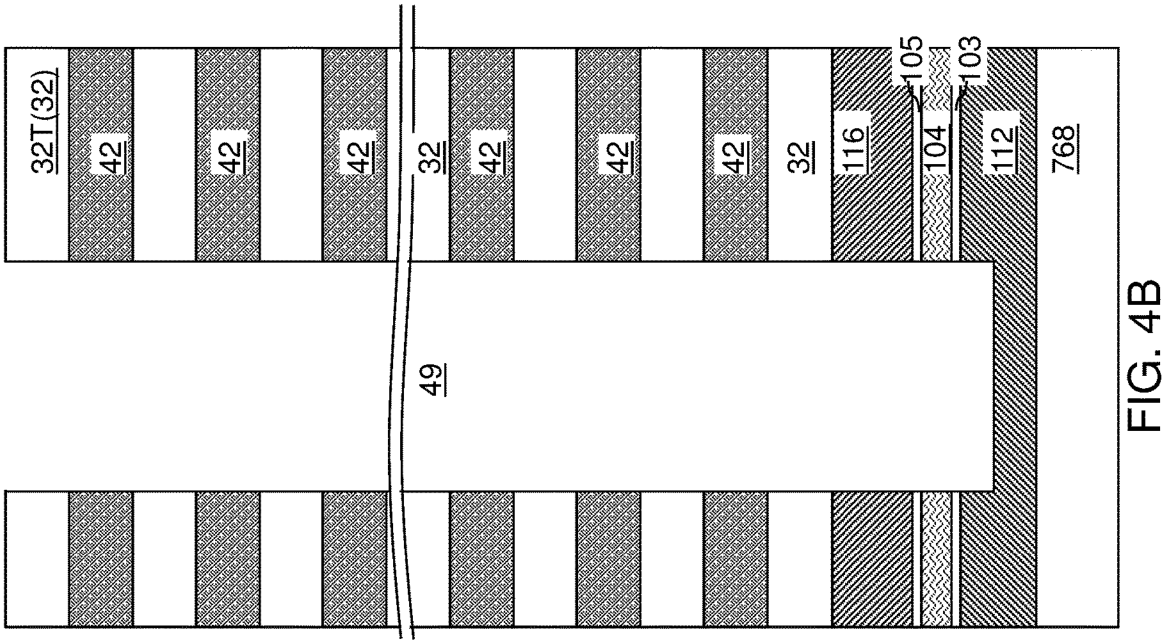
FIG. 4B is a vertical cross-sectional view of a memory opening within the exemplary structure of FIG. 4A.

Referring to FIGS. 4A and 4B, a lithographic material stack (not shown) including at least a photoresist layer can be formed over the topmost insulating layer 32T and the stepped dielectric material portion 65, and can be lithographically patterned to form openings therein. The openings include a first set of openings formed over a memory array region in which each layer of the alternating stack (32, 42) is present. and a second set of openings formed over a staircase region including the stepped surfaces of the alternating stack (32, 42). The pattern in the lithographic material stack can be transferred through the topmost insulating layer 32T or the stepped dielectric material portion 65, and through the alternating stack (32, 42) by at least one anisotropic etch that uses the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the topmost insulating layer 32T and the entirety of the alternating stack (32, 42) in the memory array region. The support openings 19 are formed through the stepped dielectric material portion 65 and the portion of the alternating stack (32, 42) that underlie the stepped surfaces in the staircase region.

The memory openings 49 extend through the entirety of the alternating stack (32, 42). The support openings 19 extend through a subset of layers within the alternating stack (32, 42). The chemistry of the anisotropic etch process used to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to on upper portion of the first source-level semiconductor layer 112. A surface of the first to source-level semiconductor layer 112 may be physically exposed at the bottom of each memory opening 49 and at the bottom of each support opening 19.

Figure 5:
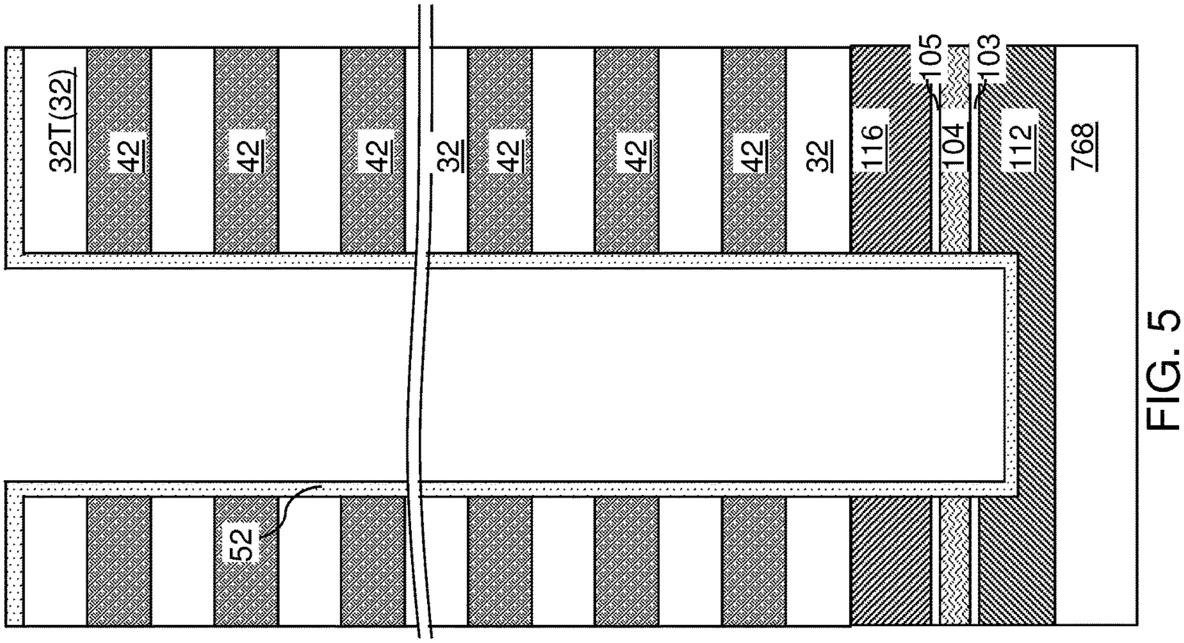
FIG. 5 is a vertical cross-sectional view of a memory opening after formation of an blocking dielectric film according to an embodiment of the present disclosure.

Referring to FIG. 5, a blocking dielectric film 52 can be formed as a stack continuous material layers over physically exposed surfaces of the memory openings 49, the support openings 19, and over the alternating stack (32, 42). According to an aspect of the present disclosure, the blocking dielectric film 52 is formed within each of the memory opening 49 and within each of the support opening 19, and comprises a first subset of component layers. The component layers that are present in the blocking dielectric film 52 may vary in various embodiments of the present disclosure.

Figure 6:
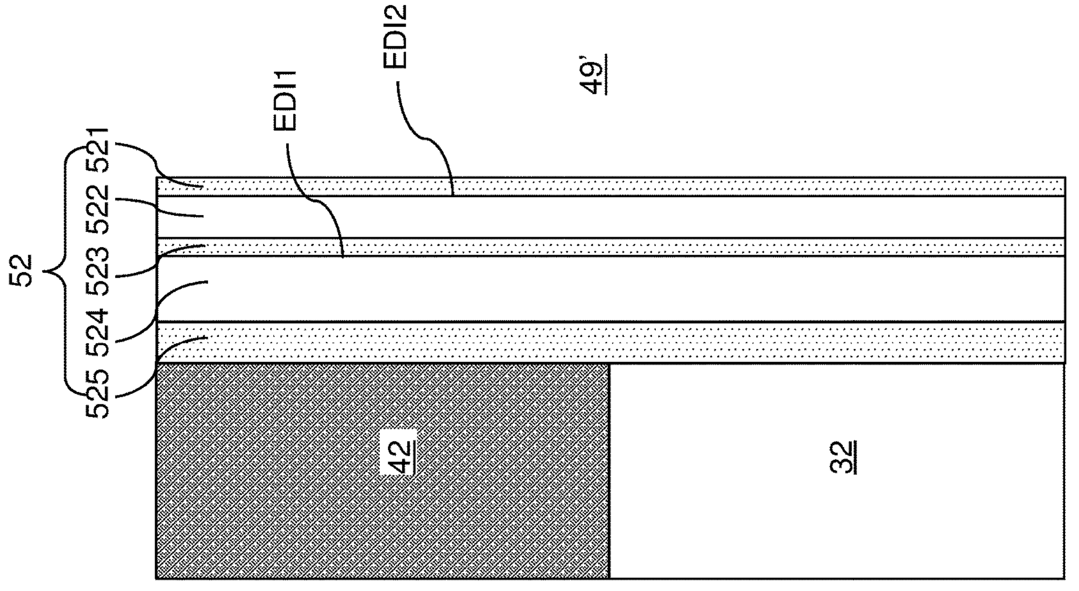
FIG. 6 illustrates a first configuration of the blocking dielectric film of FIG. 5 according to a first embodiment.

FIG. 6 illustrates the configuration of the blocking dielectric film 52 of FIG. 5 as formed in a memory opening 49. Referring to FIG. 6, the first configuration of the blocking dielectric film 52 may comprise, in the order of deposition and along an inward radial direction within each of the memory openings 49 and the support openings 19, an outer dielectric metal oxide blocking dielectric layer 525, an outer silicon oxide blocking dielectric layer 524, a middle dielectric metal oxide layer 523, an inner silicon oxide blocking dielectric layer 522, and an inner dielectric metal oxide blocking dielectric layer 521. In this case, the outer dielectric metal oxide blocking dielectric layer 525 can be deposited directly on physically exposed sidewalls of the insulating layers 32 and the sacrificial material layers 42 around each memory opening 49 and around each support opening 19. A memory cavity 49' is present within the memory opening 49.

The outer silicon oxide blocking dielectric layer 524 and the inner silicon oxide blocking dielectric layer 522 consists essentially of silicon oxide (e.g., silicon dioxide or non-stoichiometric silicon rich silicon oxide having a silicon to oxygen ration greater than 1:2). Each of the outer silicon oxide blocking dielectric layer 524 and the inner silicon oxide blocking dielectric layer 524 may be deposited by a respective conformal deposition process such as a low pressure chemical vapor deposition process (LPCVD) or atomic layer deposition (ALD). The thickness of the outer silicon oxide blocking dielectric layer 524 may be in a range from 3 nm to 10 nm, although lesser and greater thicknesses may also be employed. The thickness of the inner silicon oxide blocking dielectric layer 522 may be in a range from 3 nm to 30 nm, although lesser and greater thicknesses may also be employed.

The outer dielectric metal oxide blocking dielectric layer 525, the middle dielectric metal oxide blocking dielectric layer 523, and the inner dielectric metal oxide blocking dielectric layer 521 includes a respective dielectric metal oxide material. The dielectric metal oxide materials of the outer dielectric metal oxide blocking dielectric layer 525, the middle dielectric metal oxide blocking dielectric layer 523, and the inner dielectric metal oxide blocking dielectric layer 521 may be the same, or may be different. Generally, the dielectric metal oxide material of each of the outer dielectric metal oxide blocking dielectric layer 525, the middle dielectric metal oxide blocking dielectric layer 523, and the inner dielectric metal oxide blocking dielectric layer 521 may be independently selected from aluminum oxide or a dielectric transition metal oxide material. Exemplary dielectric transition metal oxide materials that may be employed for any of the outer dielectric metal oxide blocking dielectric layer 525, the middle dielectric metal oxide blocking dielectric layer 523, and/or the inner dielectric metal oxide blocking dielectric layer 521 include tantalum oxide, hafnium oxide, lanthanum oxide, yttrium oxide, zirconium oxide, niobium oxide, other dielectric transition metal oxides, and alloys or layer stacks thereof. In an illustrative example, each of the outer dielectric metal oxide blocking dielectric layer 525, the middle dielectric metal oxide blocking dielectric layer 523, and the inner dielectric metal oxide blocking dielectric layer 521 may comprise, and/or may consist essentially of, aluminum oxide (e.g., $Al_2O_3$). Each of the outer dielectric metal oxide blocking dielectric layer 525, the middle dielectric metal oxide blocking dielectric layer 523, and the inner dielectric metal oxide blocking dielectric layer 521 may be deposited by a respective conformal deposition process such as on low pressure chemical vapor deposition process or an atomic layer deposition process.

The thickness of the outer dielectric metal oxide blocking dielectric layer 525 may be in a range from 3 nm to 12 nm, although lesser and greater thicknesses may also be employed. The thickness of the middle dielectric metal oxide blocking dielectric layer 523 may be in a range from 0.6 nm to 4 nm, such as from 1.2 nm to 3 nm, although lesser and greater thicknesses may also be employed. The thickness of the inner dielectric metal oxide blocking dielectric layer 521 may be in a range from 0.6 nm to 4 nm, such as from 1.2 nm to 3 nm, although lesser and greater thicknesses may also be employed. Generally, the thickness of the middle dielectric metal oxide blocking dielectric layer 523 may be less than one half of the thickness of the outer silicon oxide blocking dielectric layer 524, and maybe less than one half of the thickness of the inner silicon oxide blocking dielectric layer 522. The thickness of the inner dielectric metal oxide blocking dielectric layer 521 may be the same as, or about the same as, the thickness of the middle dielectric metal oxide blocking dielectric layer 523.

According to an aspect of the present disclosure, a first electric dipole interface EDI1 is formed between the outer silicon oxide blocking dielectric layer 524 and the middle dielectric metal oxide blocking dielectric layer 523. The first electric dipole interface EDI1 has a dipole moment pointing from the outer silicon oxide blocking dielectric layer 524 toward the middle dielectric metal oxide blocking dielectric layer 523. Generally, the material of the middle dielectric metal oxide blocking dielectric layer 523 is a selected such that the middle dielectric metal oxide blocking dielectric layer 523 has a higher atomic density of oxygen atoms than the outer silicon oxide blocking dielectric layer 524. Without wishing to be bound by a particular theory, it is believed that oxygen atoms are transferred from a surface portion of the middle dielectric metal oxide blocking dielectric layer 523 to a surface portion of the outer silicon oxide blocking dielectric layer 524 upon deposition of the middle dielectric metal oxide blocking dielectric layer 523 on an inner sidewall of the outer silicon oxide blocking dielectric layer 524. As a consequence, it is believed that a surface portion of the middle dielectric metal oxide blocking dielectric layer 523 that is proximal to the outer silicon oxide blocking dielectric layer 524 should contain oxygen vacancies at a higher vacancy concentration than a surface portion of the outer silicon oxide blocking dielectric layer 524 that is proximal to the middle dielectric metal oxide blocking dielectric layer 523. Without wishing to be bound by a particular theory, it is believed that this oxygen vacancy transfer is responsible for generation of electric dipole moments at an interface between the middle dielectric metal oxide blocking dielectric layer 523 and the outer silicon oxide blocking dielectric layer 524, and formation of the first electric dipole interface EDI1. The first electric dipole interface EDI1 continuously extends across the entirety of the interface between the middle dielectric metal oxide blocking dielectric layer 523 and the outer silicon oxide blocking dielectric layer 524.

In one embodiment, the middle dielectric metal oxide blocking dielectric layer 523 consists essentially of aluminum oxide or a dielectric transition metal oxide material. In one embodiment, the middle dielectric metal oxide blocking dielectric layer 523 has a thickness that is less than one half of a thickness of the inner silicon oxide blocking dielectric layer 522, and is less than one half of a thickness of the outer silicon oxide blocking dielectric layer 524. In one embodiment, the outer dielectric metal oxide blocking dielectric layer 525 consists essentially of aluminum oxide.

In one embodiment, a second electric dipole interface EDI2 is present between the inner silicon oxide blocking dielectric layer 522 and the first electric dipole interface EDI1. In one embodiment, the second electric dipole interface EDI2 has a dipole moment pointing from the inner silicon oxide blocking dielectric layer 522 toward the first electric dipole interface EDI1.

In one embodiment, the first electric dipole interface EDI1 is located entirely within the blocking dielectric film 52, which includes the first subset of the component layers. In this case, the first electric dipole interface EDI1 may vertically extend through a plurality of sacrificial material layers 42 within the alternating stack (32, 42). In one embodiment, the second electric dipole interface EDI2 is located entirely within the blocking dielectric film 52. The second electric dipole interface EDI2 may vertically extend through a plurality of sacrificial material layers 42 within the alternating stack (32, 42).

Figure 7:
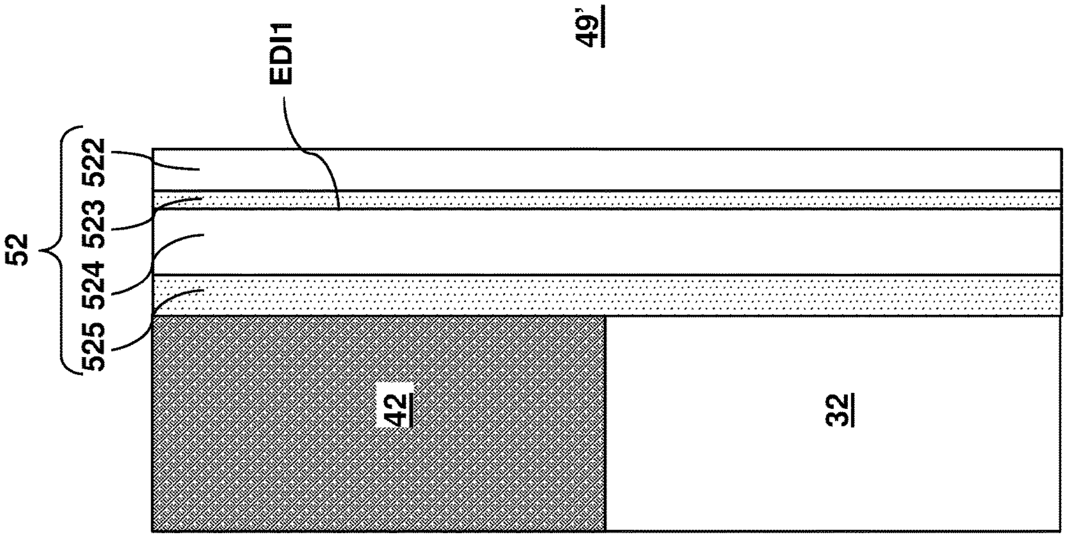
FIG. 7 illustrates a second configuration of the blocking dielectric film of FIG. 5 according to a second embodiment.

Referring to FIG. 7, a second configuration of the blocking dielectric film 52 may be derived from the first configuration of the blocking dielectric film 52 illustrated in FIG. 6 by omitting formation of the inner dielectric metal oxide blocking dielectric layer 521. In this case, the blocking dielectric film 52 may comprise, in the order of deposition and along a reverse radial direction within each of the memory openings 49 and the support openings 19, an outer dielectric metal oxide blocking dielectric layer 525, an outer silicon oxide blocking dielectric layer 524, a middle dielectric metal oxide layer 523, and an inner silicon oxide blocking dielectric layer 522. In this case, the outer dielectric metal oxide blocking dielectric layer 525 can be deposited directly on physically exposed sidewalls of the insulating layers 32 and the sacrificial material layers 42 around each memory opening 49 and around each support opening 19. A memory cavity 49' is present within the memory opening 49.

FIGS. 8A-8F illustrate a memory opening 49 during formation of a memory opening fill structure 58.

Figure 8B:
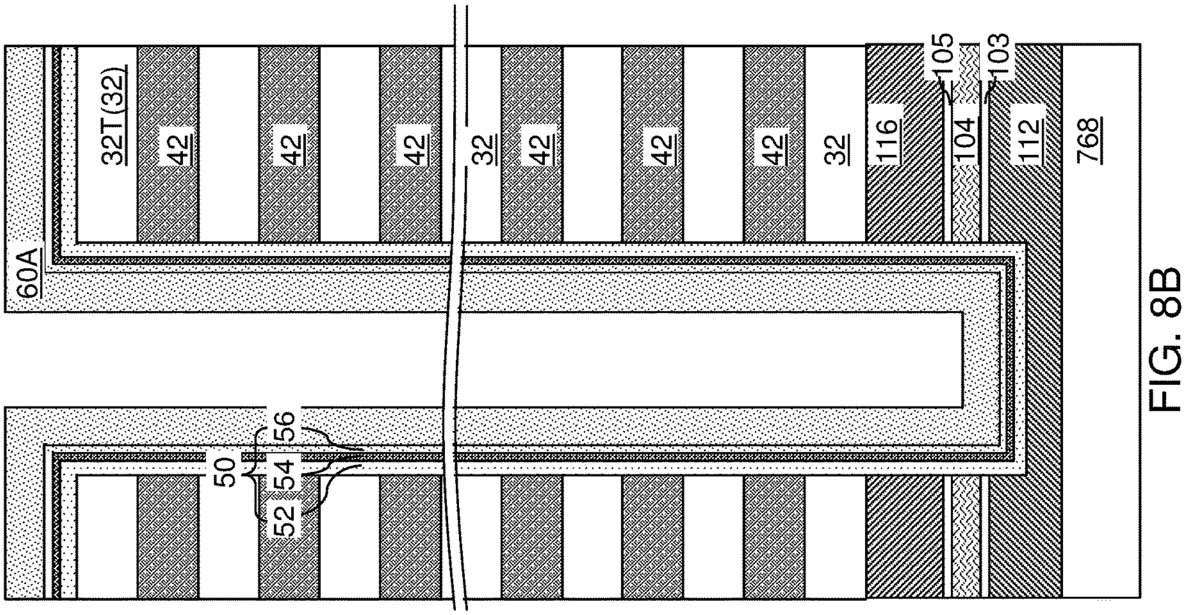
FIGS. 8A-8F illustrate a memory opening during formation of a memory opening fill structure.
Figure 8A:
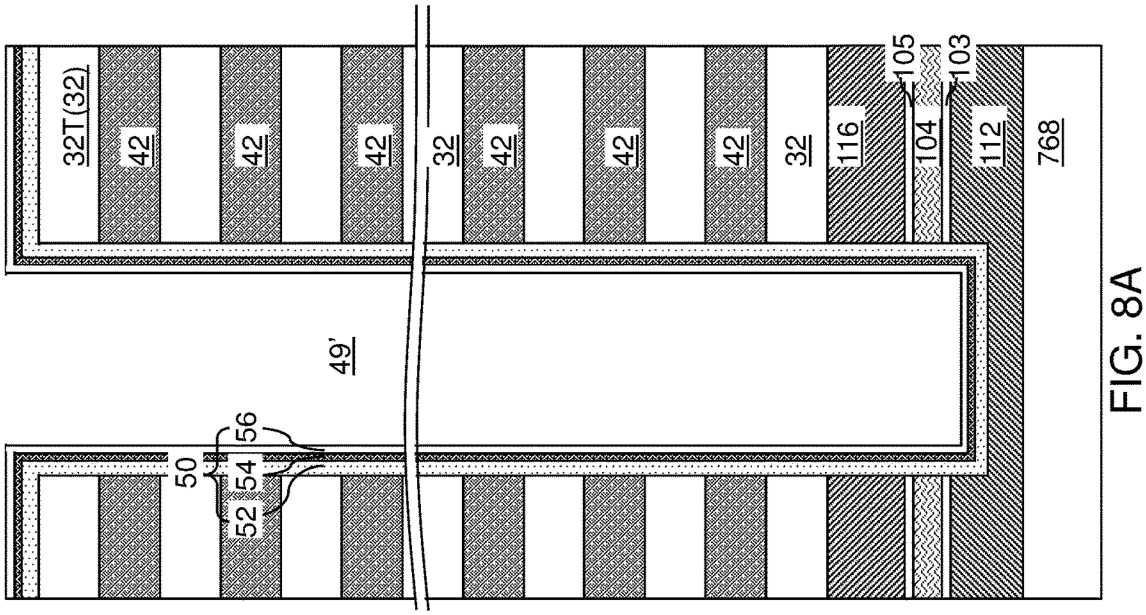

Referring to FIG. 8A, a memory material layer 54 and a dielectric material liner 56 may be sequentially deposited in each of the memory openings 49 and the support openings 19 and over the alternating stack (32, 42) as a respective continuous material layer.

Generally, the memory material layer 54 may comprise any memory material such as a charge storage material, a ferroelectric material, a phase change material, or any material that can store data bits in the form of presence or absence of electrical charges, a direction of ferroelectric polarization, electrical resistivity, or another measurable physical parameter. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer.

The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed. Each tubular portion of the memory material layer 54 that laterally surrounds a respective memory opening 49 constitutes a memory element that can store data therein. In case the memory material layer 54 comprises a charge storage layer including a charge storage material, such as silicon nitride, each memory element may be a charge storage element. Generally, each portion of the memory material layer 54 located within a respective memory opening 49 comprises a vertical stack of memory elements. Each tubular portion of the memory material layer located at a level of a sacrificial material layer 42, i.e., between a horizontal plane including the bottom surface of the sacrificial material layer 42 and a horizontal plane including the top surface of the sacrificial material layer 42, constitutes a memory element.

In one embodiment, each vertical stack of memory elements comprise portions of a charge storage layer that vertically extends continuously through a plurality of sacrificial material layers 42, and/or through each of the sacrificial material layers 42, within the alternating stack (32, 46). In the first embodiment employing the configuration illustrated in FIG. 6, the blocking dielectric film 52 comprises an inner dielectric metal oxide blocking dielectric layer 521 that contacts an inner sidewall of the inner silicon oxide blocking dielectric layer 522 and an outer sidewall of the charge storage layer (e.g., the memory material layer 54). In the second embodiment employing the configuration illustrated in FIG. 7, the inner silicon oxide blocking dielectric layer 522 is in contact with an outer sidewall of the charge storage layer (e.g., the memory material layer 54).

The dielectric material liner 56 is an optional material layer that may, or may not, be employed. In case the memory material layer 54 comprises a charge storage layer, the dielectric material liner 56 may comprise a tunneling dielectric layer including a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The dielectric material liner 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric material liner 56 may include a stack of a silicon oxide layer, a silicon oxynitride layer, and a second silicon oxide layer, which is commonly known as an ONO stack. In one embodiment, the dielectric material liner 56 may include a silicon oxide layer that is substantially free of carbon or a silicon oxynitride layer that is substantially free of carbon. The thickness of the dielectric material liner 56 may be in a range from 2 nm to 20 nm, although lesser and greater thicknesses may also be used.

The combination of the blocking dielectric film 52, the memory material layer 54, and the dielectric material liner 56 is herein referred to as a memory film 50. The memory film 50 can be a stack of continuous material layers that extend into each of the memory openings 49 and the support openings 19.

Referring to FIG. 8B, an amorphous channel material layer 60A can be deposited over the memory film 50. The amorphous channel material layer 60A comprises at least one elemental semiconductor material (e.g., amorphous silicon), at least one III-V compound semiconductor material, at least one II-VI compound semiconductor material, or other semiconductor materials known in the art. The amorphous channel material layer 60A may be intrinsic, or may include dopants of a first conductivity type (which may be p-type dopants and/or n-type dopants) at a total atomic concentration that is not greater than $1.0\times10^{15}/cm^3$, and/or is not greater than $1.0\times10^{14}/cm^3$, and/or is not greater than $1.0\times10^{13}/cm^3$. The thickness of the amorphous channel material layer 60A is selected such that a vertically-extending unfilled void remains in each memory opening 49. For example, the thickness of the amorphous channel material layer 60A may be in a range from 20 nm to 100 nm, although lesser and greater thicknesses may also be employed.

Figure 8D:
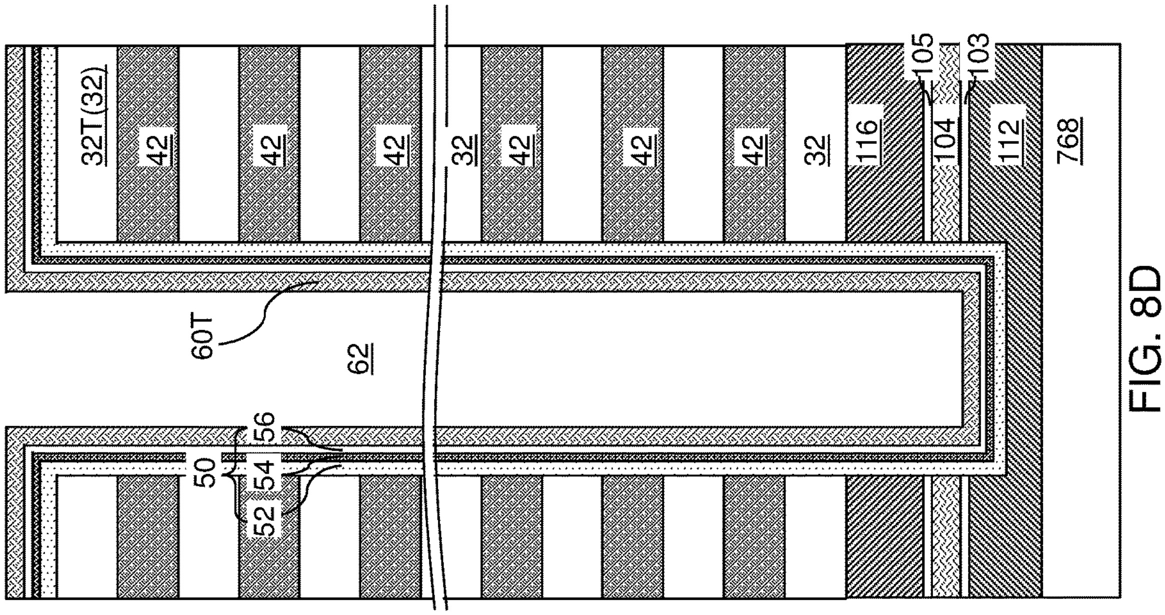
Figure 8C:
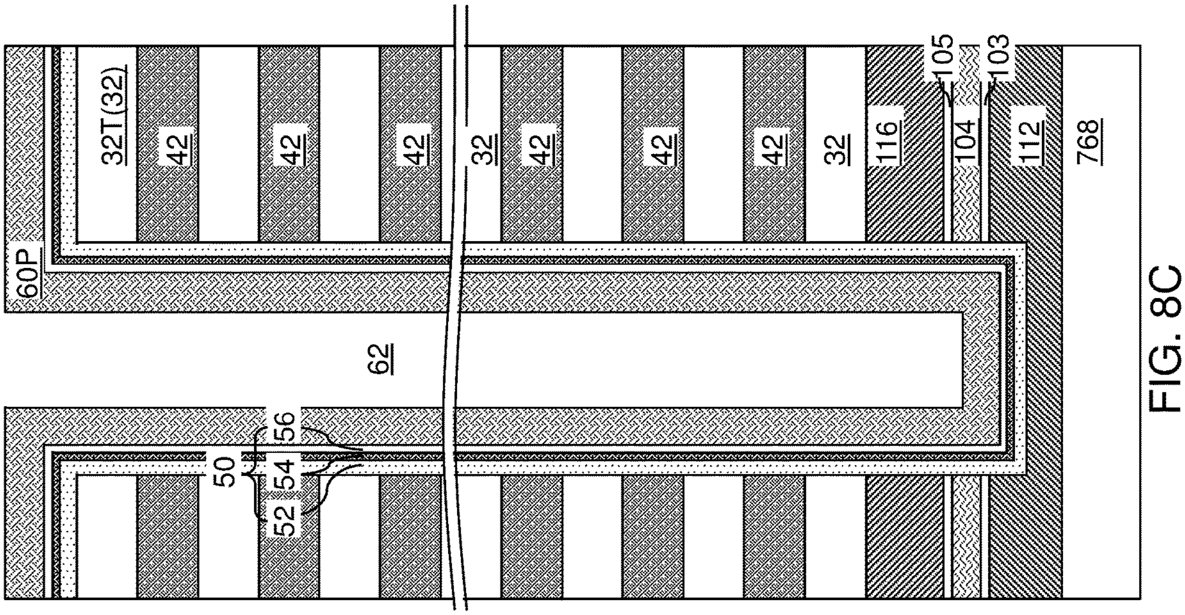

Referring to FIG. 8C, an anneal process can be performed to convert the amorphous channel material layer 60A into a polycrystalline channel material layer 60P. The elevated temperature of the anneal process may be in a range from 650 degrees Celsius to 1,100 degrees Celsius. The duration of the anneal process may be in a range from 1 second to 2 hours. Generally, the higher the elevated temperature of the anneal process, the shorter the duration of the anneal process. Alternatively, the channel material layer may be deposited in the polycrystalline state (e.g., as a polysilicon layer).

Referring to FIG. 8D, the polycrystalline channel material layer 60P may be isotropically etched back such that a remaining portion of the polycrystalline channel material layer 60P has a thickness in a range from 3 nm to 60 nm, such as from 6 nm to 20 nm. The thinned remaining portion of the polycrystalline channel material layer 60P is herein referred to as a thinned semiconductor channel material layer 60T. The thinned semiconductor channel material layer 60T includes polycrystalline semiconductor material.

Figure 8F:
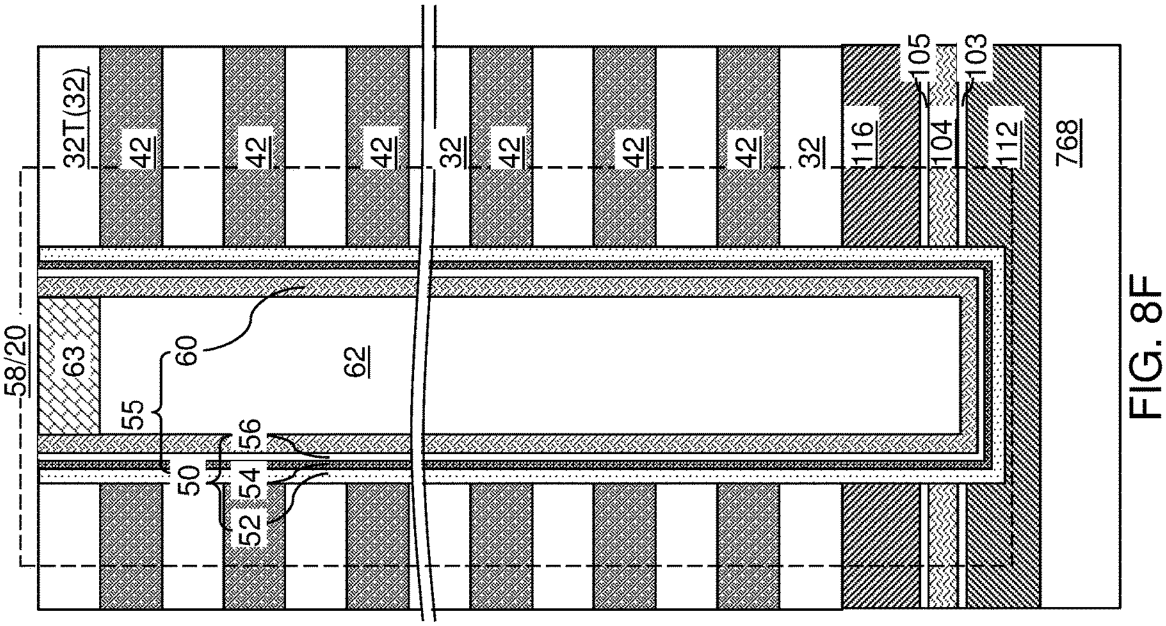
Figure 8E:
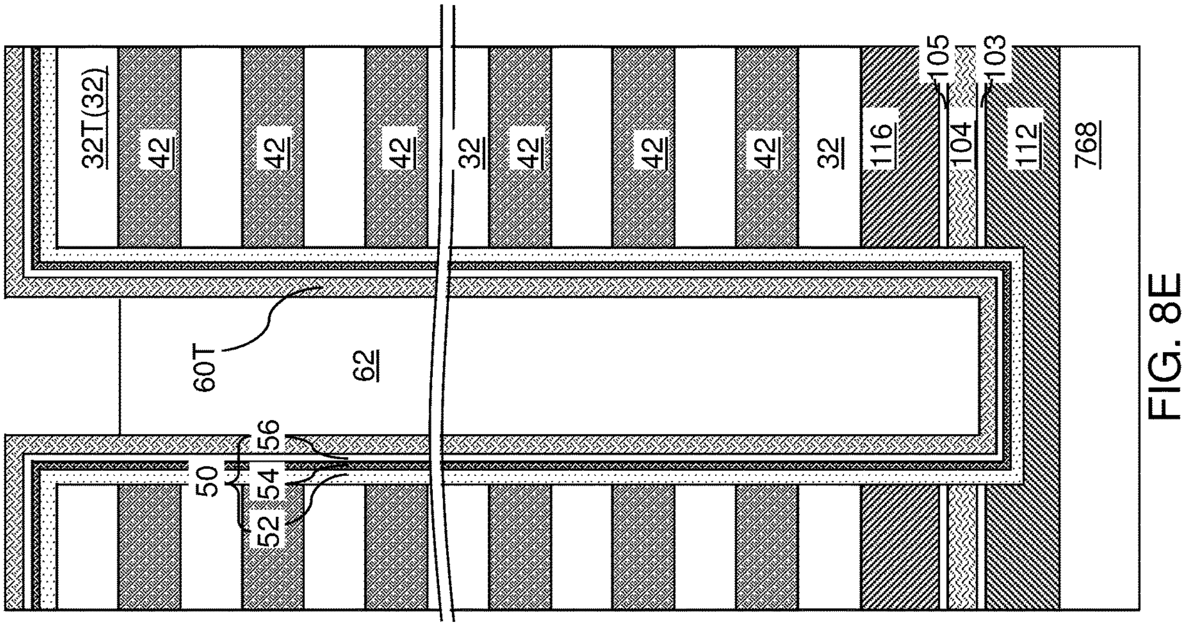

Referring to FIG. 8E, a dielectric core layer may be deposited in unfilled volumes of the memory openings 49 and/or the support openings 19. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the topmost surface of the alternating stack (32, 42) may be removed, for example, by a recess etch. The recess etch continues until top surfaces of the remaining portions of the dielectric core layer are recessed to a height between the top surface of the topmost insulating layer 32T and the bottom surface of the topmost insulating layer 32. Each remaining portion of the dielectric core layer constitutes a dielectric core 62.

Referring to FIG. 8F, a doped semiconductor material having a doping of a second conductivity type may be deposited in cavities overlying the dielectric cores 62. The second conductivity type is the opposite of the conductivity type. For example, if the conductivity type is p-type, the second conductivity type is n-type, and vice versa. Portions of the deposited doped semiconductor material, thinned semiconductor channel material layer 60T, the dielectric material liner 56, the memory material layer 54, and the blocking dielectric film 52 that overlie the horizontal plane including the top surface of the topmost insulating layer 32T may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0\times10^{18}/cm^3$ to $2.0\times10^{21}/cm^3$, although lesser and greater dopant concentrations may also be used. The doped semiconductor material may be, for example, doped polysilicon.

Each remaining portion of the thinned semiconductor channel material layer 60T constitutes a vertical semiconductor channel 60 through which electrical current may flow when a vertical NAND device including the vertical semiconductor channel 60 is turned on. A dielectric material liner 56 is surrounded by a memory material layer 54, and laterally surrounds a vertical semiconductor channel 60. Each adjoining set of a blocking dielectric film 52, a memory material layer 54, and a dielectric material liner 56 collectively constitute a memory film 50, which may store electrical charges with a macroscopic retention time in some embodiments. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a vertical semiconductor channel 60, a dielectric material liner 56, a plurality of memory elements comprising portions of a memory material layer 54, and a blocking dielectric film 52. Each combination of a memory stack structure 55, a dielectric core 62, and a drain region 63 within an memory opening 49 constitutes a memory opening fill structure 58. Generally, memory opening fill structures 58 are formed within the memory openings 49. Each of the memory opening fill structures 58 comprises a respective memory film 50 and a respective vertical semiconductor channel 60.

Figure 9:
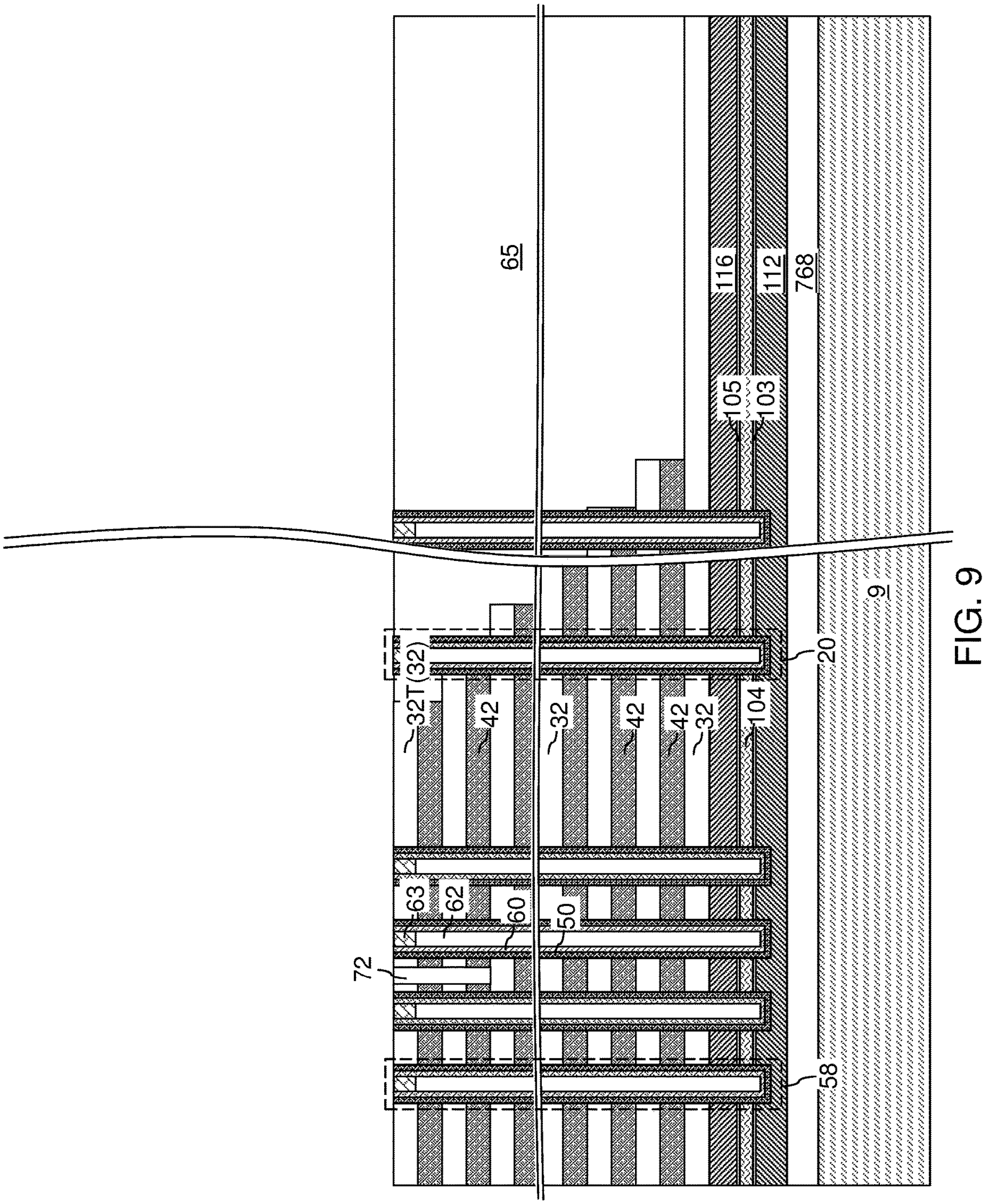
FIG. 9 is a schematic vertical cross-sectional view of the exemplary structure after formation of memory opening fill structures and support pillar structures according to an embodiment of the present disclosure.

Referring to FIG. 9, each support opening 19 can be filled with a respective set of material portions having the same material composition as a corresponding component in a memory opening fill structure 58. Each set of material portions filling a support opening 19 is herein referred to as a support pillar structure 20. Generally, the support pillar structures 20 are formed in a staircase region in which stepped surfaces of the alternating stack (32, 42) are present. Each of the memory opening fill structures 58 comprises a respective vertical semiconductor channel 60 and a respective vertical stack of memory elements, which may comprise portions of a respective memory material layer 54 that are located at levels of the sacrificial material layers 42. At least one semiconductor material layer within the in-process source-level material layers (112, 104, 116), such as the first source-level semiconductor layer 112 and/or the second source-level semiconductor layer 116, is in contact with each of the memory opening fill structures 58.

Figure 10A:
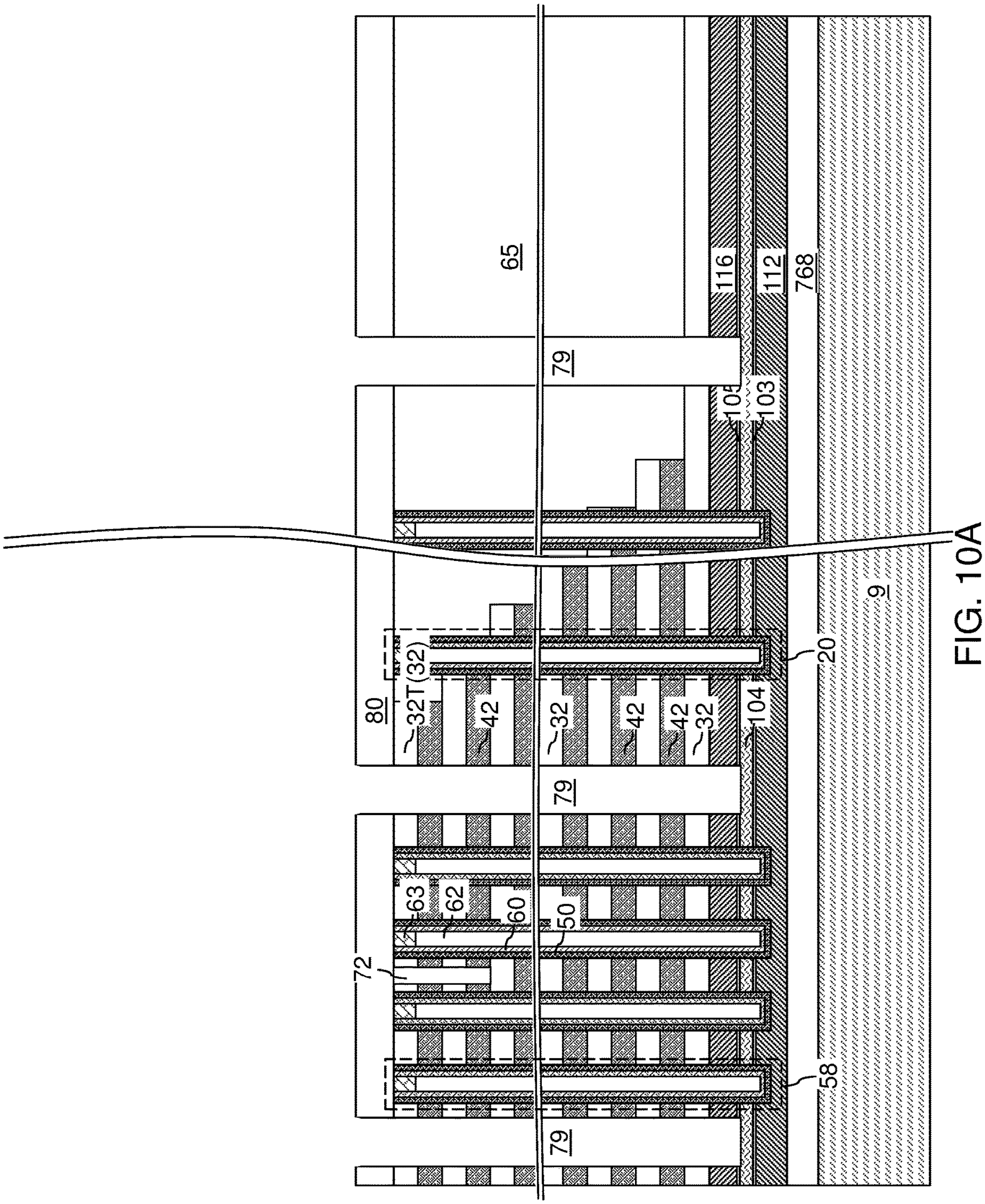
FIG. 10A is a schematic vertical cross-sectional view of the exemplary structure after formation of a contact-level dielectric layer and through-stack trenches according to an embodiment of the present disclosure.
Figure 10B:
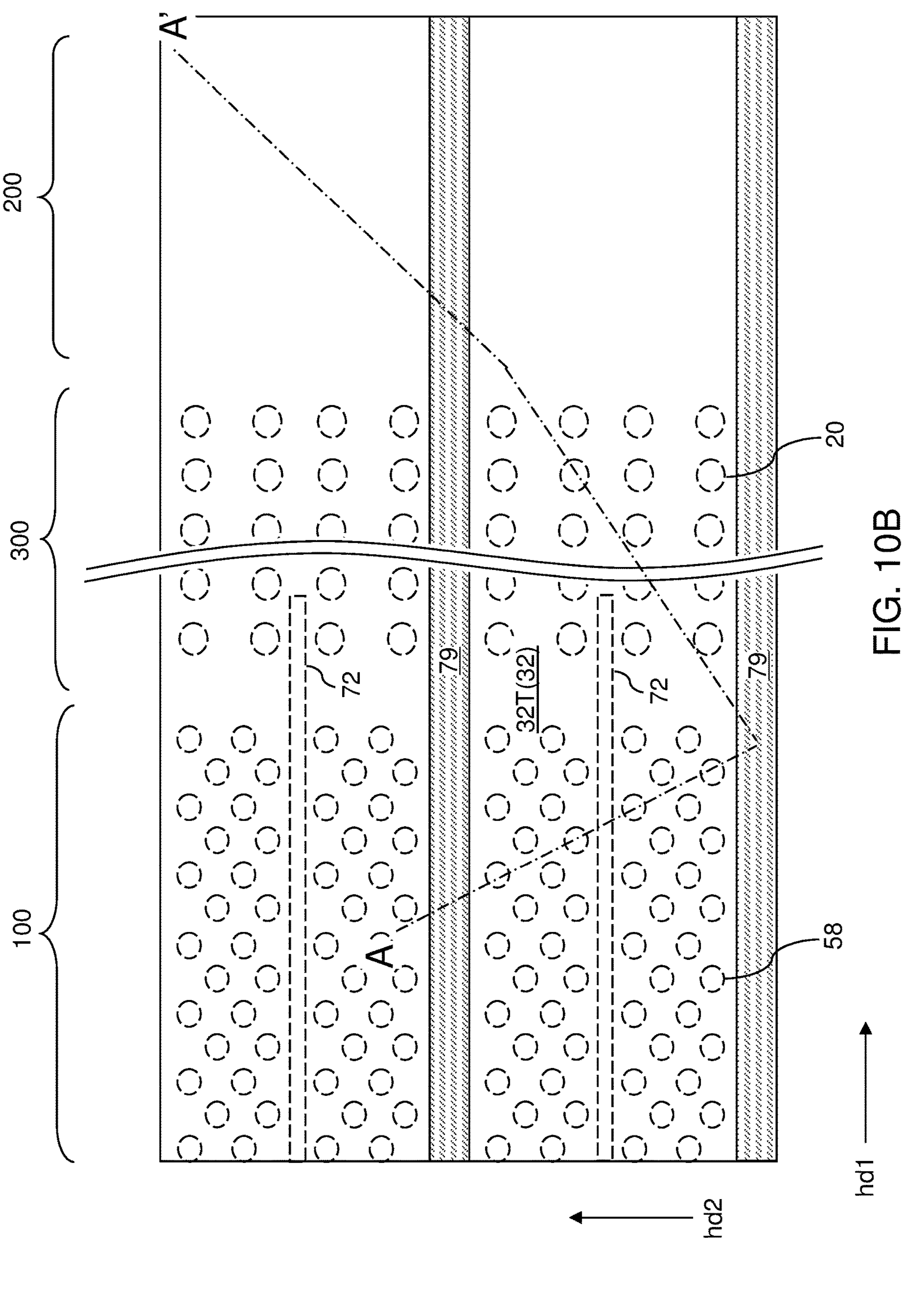
FIG. 10B is a partial see-through top-down view of the exemplary structure of FIG. 10A. The hinged vertical plane A-A' is the plane of the schematic vertical cross-sectional view of FIG. 10A.

Referring to FIGS. 10A and 10B, a contact-level dielectric layer 80 can be formed over the alternating stack (32, 42) of insulating layer 32 and sacrificial material layers 42, and over the memory opening fill structures 58 and the support pillar structures 20. The contact-level dielectric layer 80 includes a dielectric material that is different from the dielectric material of the sacrificial material layers 42. For example, the contact-level dielectric layer 80 can include silicon oxide. The contact-level dielectric layer 80 can have a thickness in a range from 50 nm to 500 nm, although lesser and greater thicknesses can also be used.

A photoresist layer (not shown) can be applied over the contact-level dielectric layer 80, and is lithographically patterned to form openings in areas between clusters of memory opening fill structures 58. The pattern in the photoresist layer can be transferred through the contact-level dielectric layer 80, the alternating stack (32, 42) and/or the stepped dielectric material portion 65 using an anisotropic etch to form through-stack trenches 79, which vertically extend from the top surface of the contact-level dielectric layer 80 at least to the top surface of the source-level sacrificial layer 104.

In one embodiment, the through-stack trenches 79 can laterally extend along a first horizontal direction hd1 and can be laterally spaced apart one from another along a second horizontal direction hd2 that is perpendicular to the first horizontal direction hd1. The memory opening fill structures 58 can be arranged in rows that extend along the first horizontal direction hd1. The drain-select-level isolation structures 72 can laterally extend along the first horizontal direction hd1. Each through-stack trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory opening fill structures 58 can be located between a neighboring pair of a through-stack trench 79 and a drain-select-level isolation structure 72, or between a neighboring pair of drain-select-level isolation structures 72. In one embodiment, the through-stack trenches 79 can include a source contact opening in which a source contact via structure can be subsequently formed. The photoresist layer can be removed, for example, by ashing.

Figure 11:
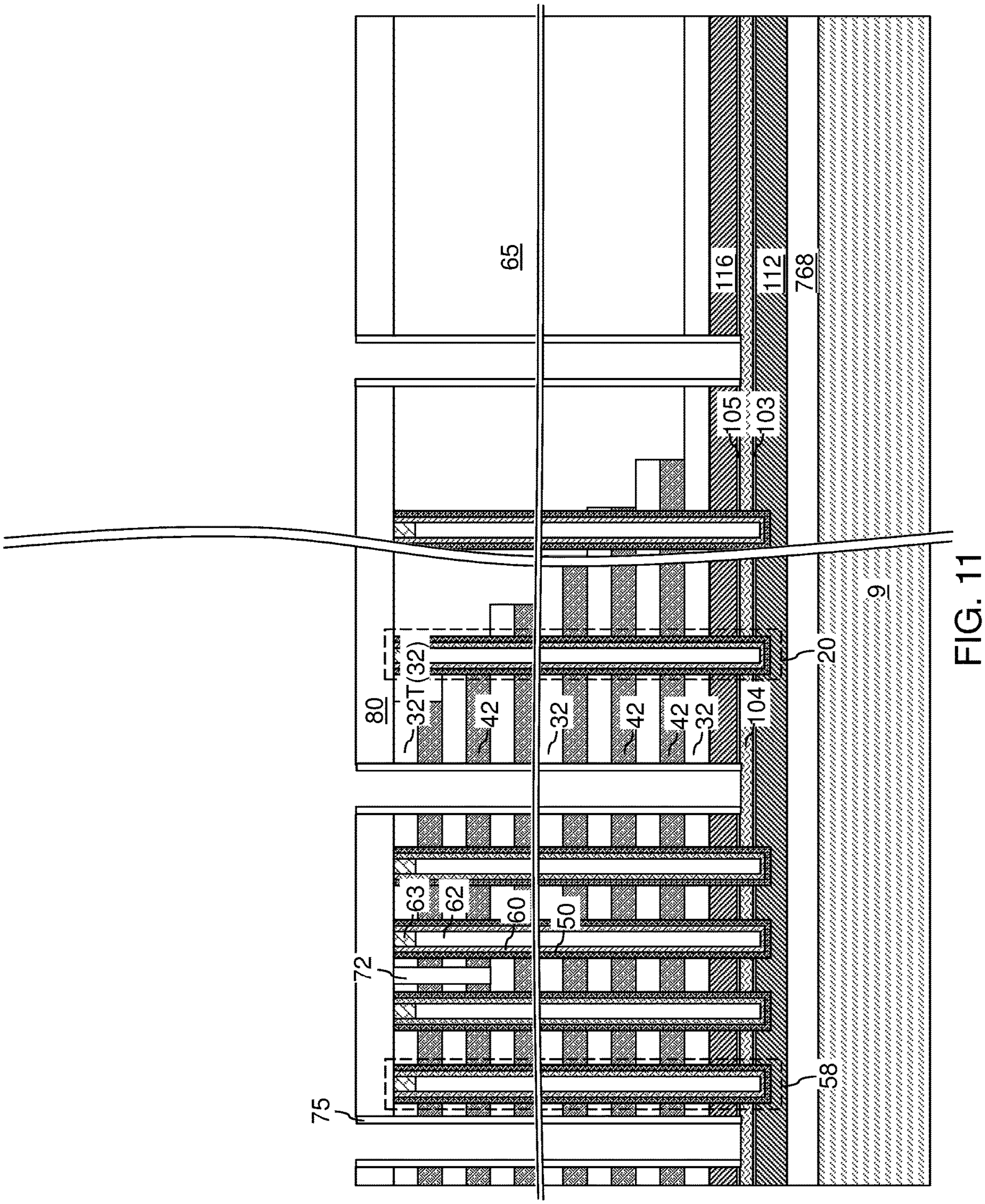
FIG. 11 is a schematic vertical cross-sectional view of the exemplary structure after formation of sacrificial etch stop spacers according to an embodiment of the present disclosure.

Referring to FIG. 11, a sacrificial etch stop material may be conformally deposited in the through-stack trenches 79 and over the contact-level dielectric layer 80, and can be anisotropically etched to form sacrificial etch stop spacers 75 at a peripheral portion of each of the through-stack trenches 79. The sacrificial etch stop material is different from the material of the source-level sacrificial layer 104. In an illustrative example, if the source-level sacrificial layer 104 comprises silicon nitride, the sacrificial etch stop material may comprise silicon oxide. The thickness of the sacrificial etch stop spacers 75, as measured between an inner sidewall and an outer sidewall of a respective sacrificial etch stop spacer 75, may be in a range from 10 nm to 100 nm, although lesser and greater thicknesses may also be employed.

Figure 12:
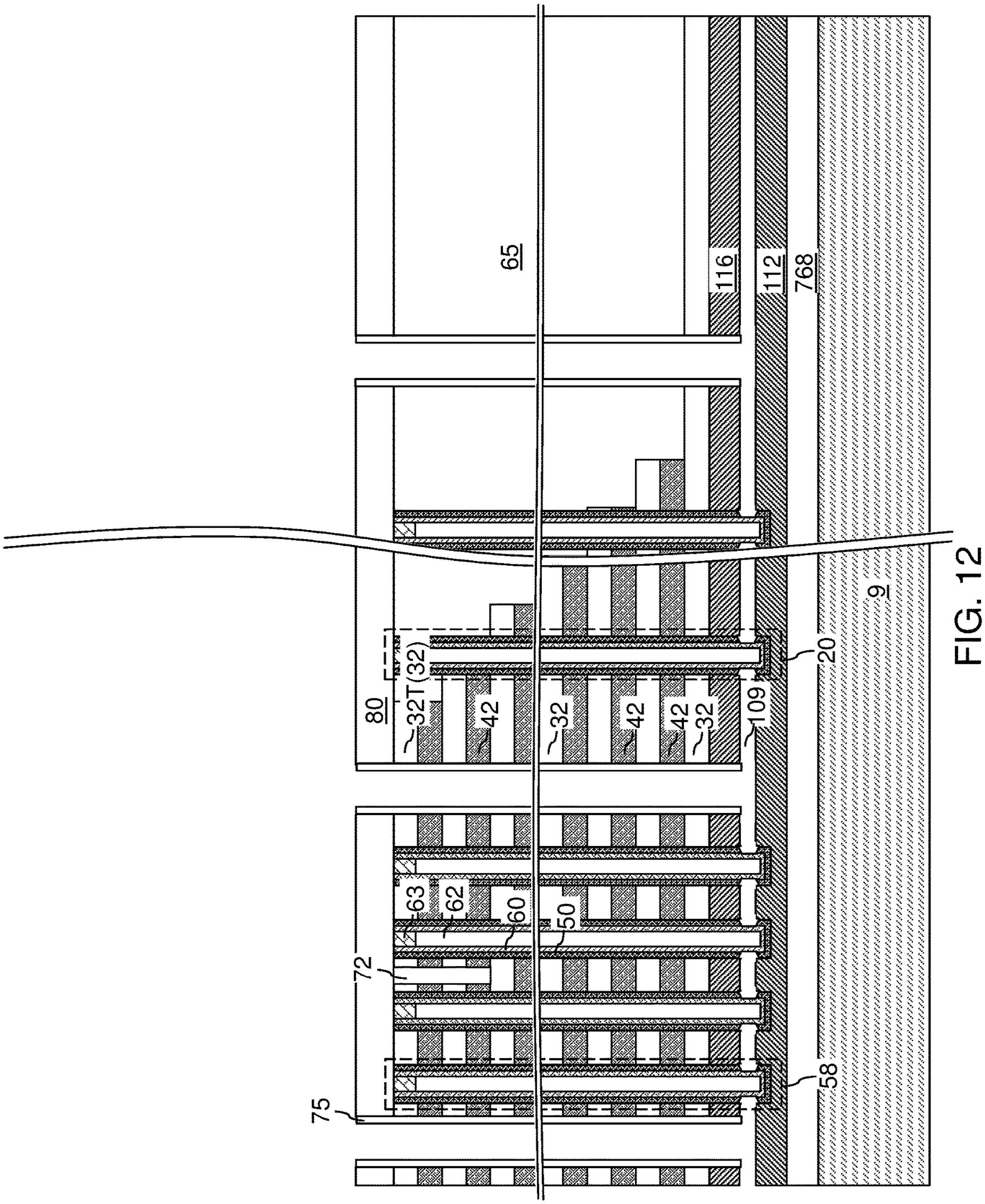
FIG. 12 is a schematic vertical cross-sectional view of the exemplary structure after formation of a source-level cavity according to an embodiment of the present disclosure.

Referring to FIG. 12, a selective isotropic etch process can be performed to etch the material of the source-level sacrificial layer 104 selective to the materials of the first and second dielectric liners (103, 105) and selective to the material of the sacrificial etch stop spacers 75. For example, if the source-level sacrificial layer 104 comprises silicon nitride, a wet etch process employing hot phosphoric acid may be performed to etch the source-level sacrificial layer 104 selective to the source-level semiconductor layers (112, 116), the sacrificial etch stop spacers 75, and the contact-level dielectric layer 80. If the source-level sacrificial layer 104 comprises undoped amorphous silicon, a wet etch process employing tetramethylammonium hydroxide may be performed to etch the source-level sacrificial layer 104 selective to the source-level semiconductor layers (112, 116), the sacrificial etch stop spacers 75, and the contact-level dielectric layer 80. A source cavity 109 can be formed in a volume from which the source-level sacrificial layer 104 is removed.

Subsequently, a sequence of isotropic etch processes may be performed to remove physically exposed portions of the memory films 50. The first and second dielectric liners (103, 104) may be collaterally etched during removal of the physically exposed portions of the memory films 50, For example, the sequence of isotropic etch processes may sequentially etch portions of the blocking dielectric film 52, memory material layers 54, and the dielectric material liners 56. A cylindrical outer surface segment of each vertical semiconductor channel 60 can be physically exposed to the source cavity 109.

Figure 13:
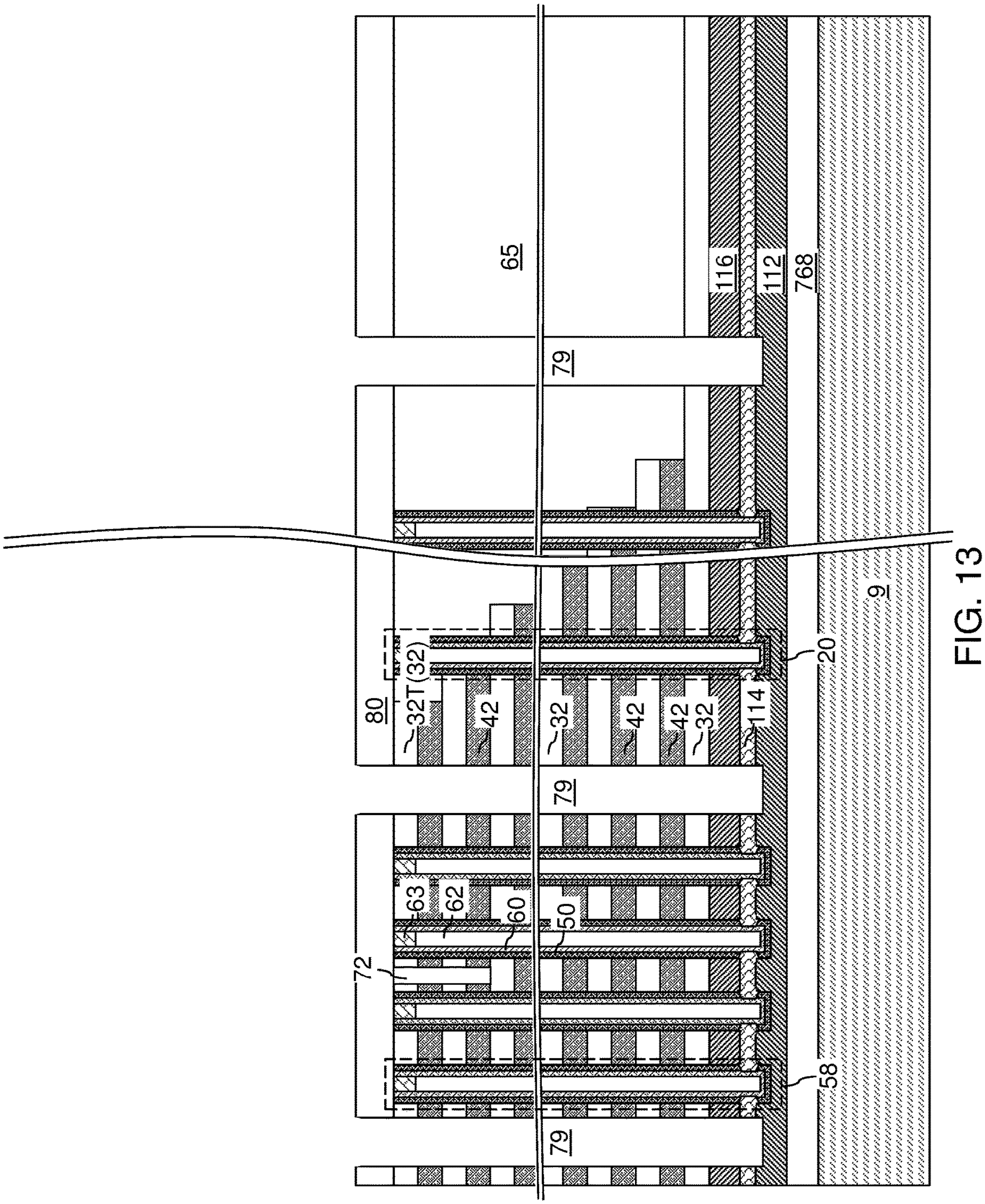
FIG. 13 is a schematic vertical cross-sectional view of the exemplary structure after formation of a source layer according to an embodiment of the present disclosure.

Referring to FIG. 13, a source contact layer 114 can be formed in the source cavity 109 by depositing a heavily doped semiconductor material (e.g., heavily doped polysilicon) having a doping of the second conductivity type in the source cavity 109. In one embodiment, the source contact layer 114 may be formed by a selective doped semiconductor deposition process in which a semiconductor precursor gas (such as silane, disilane, or dichlorosilane) and a dopant gas (such as phosphine, arsine, or stibine) are flowed into a process chamber concurrently with, or alternately with, an etchant gas (such as hydrogen chloride gas). In this case, the growth rate of a doped semiconductor material from semiconductor surfaces is greater than the etch rate during the selective doped semiconductor deposition process, and the growth rate of the doped semiconductor material from dielectric surfaces (such as the surfaces of the sacrificial etch stop spacers 75 and the contact-level dielectric layer 80) is less than the etch rate during the selective doped semiconductor deposition process. Thus, the doped semiconductor material grows only form the semiconductor surfaces of the first and second source-level semiconductor layers (112, 116) to fill the source cavity 109, thereby forming the source contact layer 114.

Alternatively, the source contact layer 114 may be formed by a non-selective doped semiconductor deposition process. In this case, a doped semiconductor material can be deposited on all physically exposed surfaces of the first exemplary structure. The duration of the non-selective doped semiconductor deposition process can be selected such that the entire volume of the source cavity 109 is filled with the doped semiconductor material. An etch back process can be performed to remove portions of the doped semiconductor material that are present in the through-stack trenches 79 or above the contact-level dielectric layer 80. The etch back process may comprise an isotropic etch process or an anisotropic etch process. The remaining portion of the doped semiconductor material that fills the source cavity 109 constitutes the source contact layer 114.

The combination of the first source-level semiconductor layer 112, the source contact layer 114, and the second source-level semiconductor layer 116 constitutes source-level material layers (112, 114, 116). Generally, the source-level material layers (112, 114, 116) comprise at least one semiconductor material layer including a doped semiconductor material. In one embodiment, each of the first source-level semiconductor layer 112, the source contact layer 114, and the second source-level semiconductor layer 116 may be a doped semiconductor (e.g., polysilicon) layer having a doping of the second conductivity type, which is the opposite of the first conductivity type of the vertical semiconductor channels 60. As such, p-n junctions may be formed between the source contact layer 114 and the vertical semiconductor channels 60. The dopant concentrations in the first source-level semiconductor layer 112, the source contact layer 114, and the second source-level semiconductor layer 116 may be different from each other. In one embodiment, each of the vertical semiconductor channels 60 comprises a respective cylindrical surface in contact with a respective surface segment of the source contact layer 114.

Figure 14:
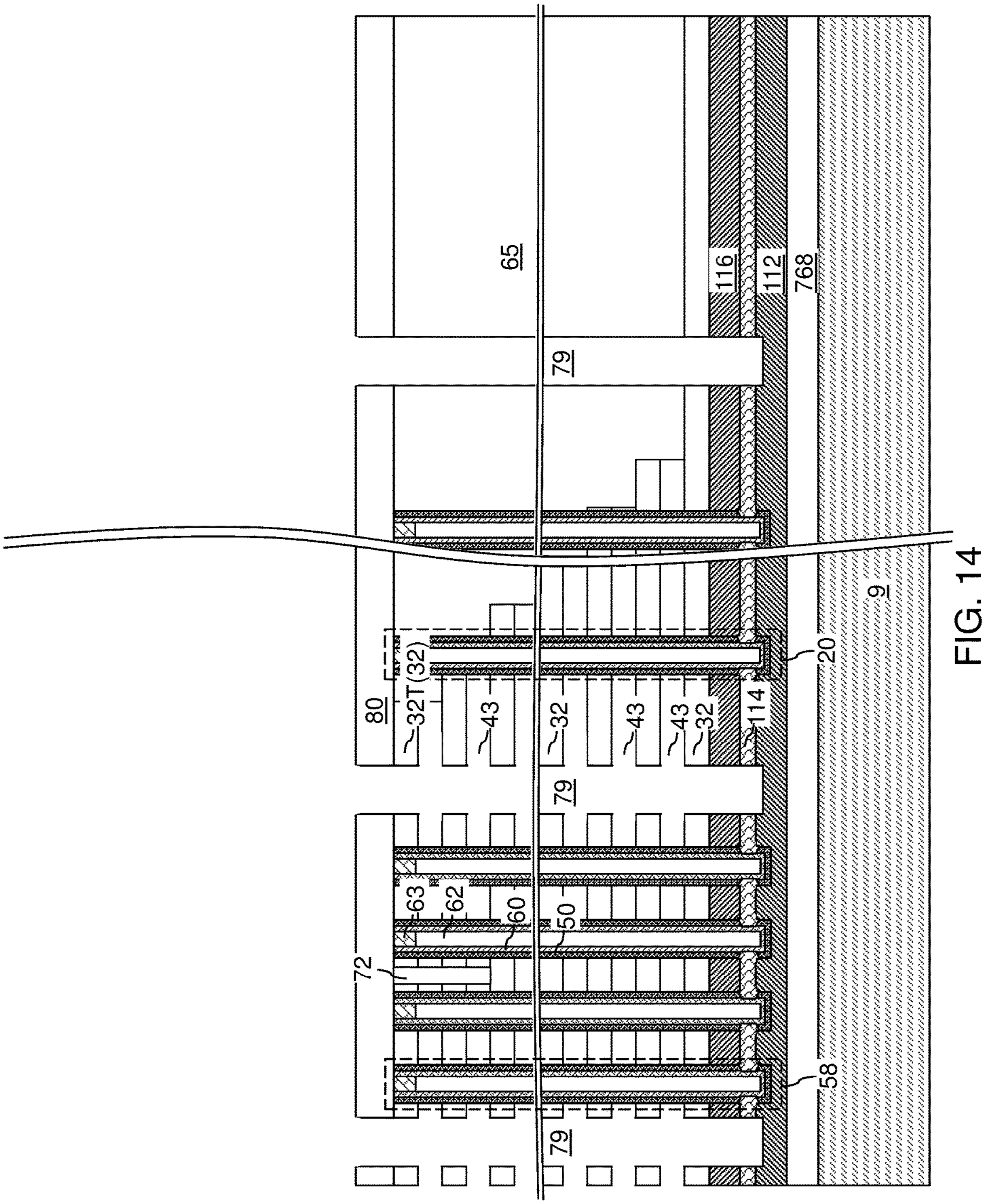
FIG. 14 is a schematic vertical cross-sectional view of the exemplary structure after removal of the sacrificial etch stop spacers and formation of backside recesses according to an embodiment of the present disclosure.

Referring to FIG. 14, an etchant that selectively etches the second material of the sacrificial material layers 42 with respect to the first material of the insulating layers 32 can be introduced into the through-stack trenches 79, for example, using an etch process. Backside recesses 43 are formed in volumes from which the sacrificial material layers 42 are removed. The removal of the second material of the sacrificial material layers 42 can be selective to the first material of the insulating layers 32, the material of the stepped dielectric material portion 65, the semiconductor material of the second source-level semiconductor layer 116, and the material of the outermost layer of the memory films 50. In one embodiment, the sacrificial material layers 42 can include silicon nitride, and the materials of the insulating layers 32 and the stepped dielectric material portion 65 can be silicon oxide.

The etch process that removes the second material selective to the first material and the outermost layer of the memory films 50 can be a wet etch process using a wet etch solution, or can be a gas phase (dry) etch process in which the etchant is introduced in a vapor phase into the through-stack trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials used in the art. The support pillar structure 20, the stepped dielectric material portion 65, and the memory opening fill structures 58 provide structural support while the backside recesses 43 are present within volumes previously occupied by the sacrificial material layers 42. Generally, the backside recesses 43 can be formed by removing the sacrificial material layers 42 selective to the insulating layers 32 and the memory opening fill structures 58.

Figure 15:
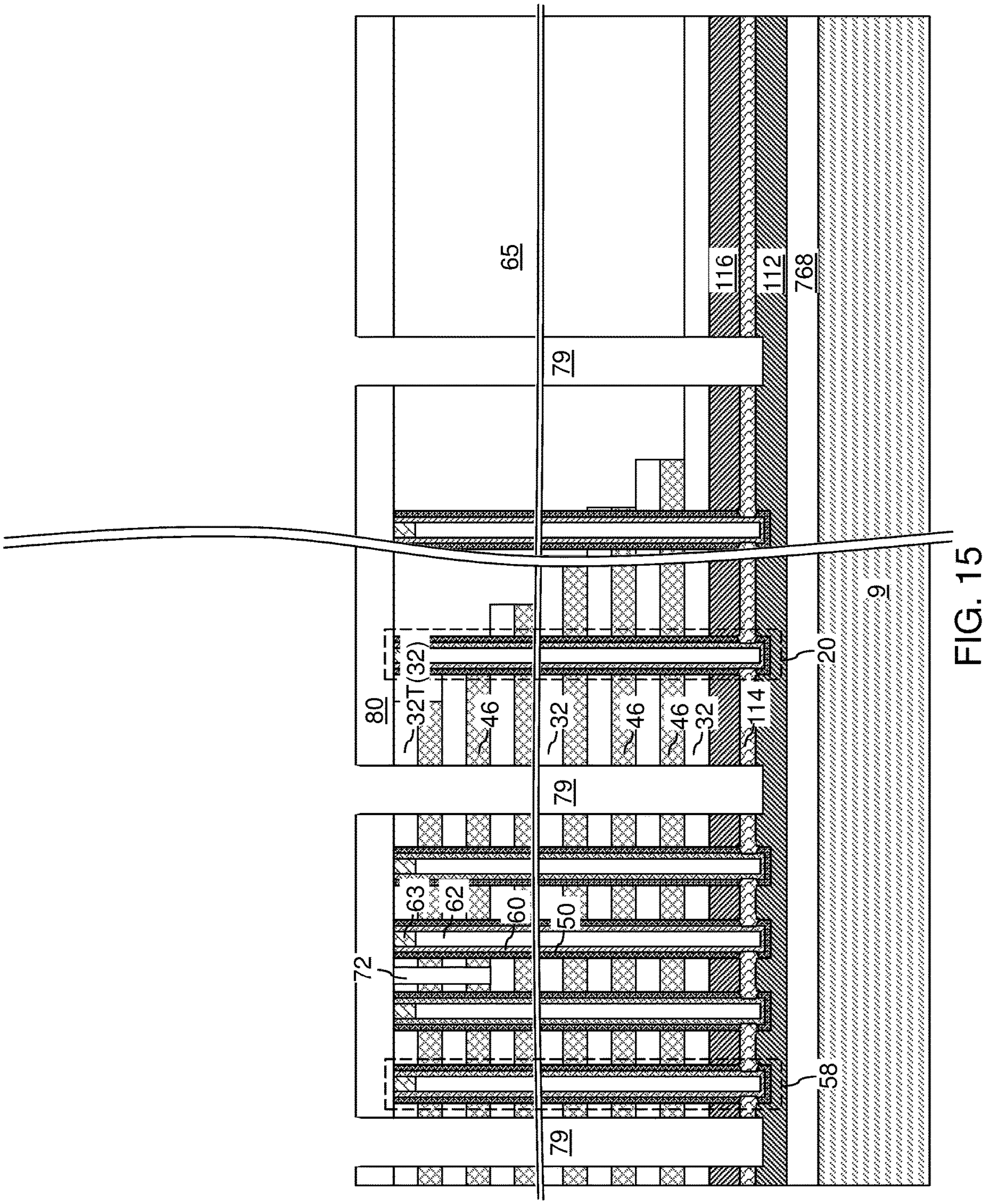
FIG. 15 is a schematic vertical cross-sectional view of the exemplary structure after formation of electrically conductive layers according to an embodiment of the present disclosure.

Referring to FIG. 15, at least one conductive material may be deposited in the plurality of backside recesses 43, on the sidewalls of the through-stack trenches 79, and over the contact-level dielectric layer 80. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses may be a combination of titanium nitride layer and a tungsten fill material. Electrically conductive layers 46 may be formed in the backside recesses 43 by deposition of the at least one conductive material. A plurality of electrically conductive layers 46 may be formed in the plurality of backside recesses 43, and a continuous metallic material layer (not shown) may be formed on the sidewalls of each through-stack trench 79 and over the contact-level dielectric layer 80. Each of the electrically conductive layers may include a respective conductive metallic nitride liner and a respective conductive fill material. A backside cavity is present in the portion of each through-stack trench 79 that is not filled with the continuous metallic material layer.

Residual conductive material may be removed from inside the through-stack trenches 79. Specifically, the deposited metallic material of the continuous metallic material layer may be etched back from the sidewalls of each through-stack trench 79 and from above the contact-level dielectric layer 80, for example, by an anisotropic or isotropic etch. Each remaining portion of the deposited metallic material in the backside recesses 43 constitutes an electrically conductive layer 46. Sidewalls of the electrically conductive material layers 46 may be physically exposed to a respective through-stack trench 79.

Each electrically conductive layer 46 may be a conductive sheet including openings therein. A subset of the openings through each electrically conductive layer 46 may be filled with memory opening fill structures 58. A second subset of the openings through each electrically conductive layer 46 may be filled with the support pillar structures 20. A subset of the electrically conductive layers 46 may comprise word lines for the memory elements. The underlying semiconductor devices 720 may comprise word line switch devices configured to control a bias voltage to respective word lines, and/or bit line driver devices, such as sense amplifiers.

The lateral extents of the electrically conductive layers 46 decrease with a vertical distance from the at least one semiconductor material layer (112, 114, 116). The dielectric material portion 65 contacts stepped surfaces of the alternating stack (32, 46), and has a variable lateral extent that increases stepwise with a vertical distance from a horizontal plane including an interface between the alternating stack (32, 46) and the at least one semiconductor material layer (112, 114, 116).

Figure 16:
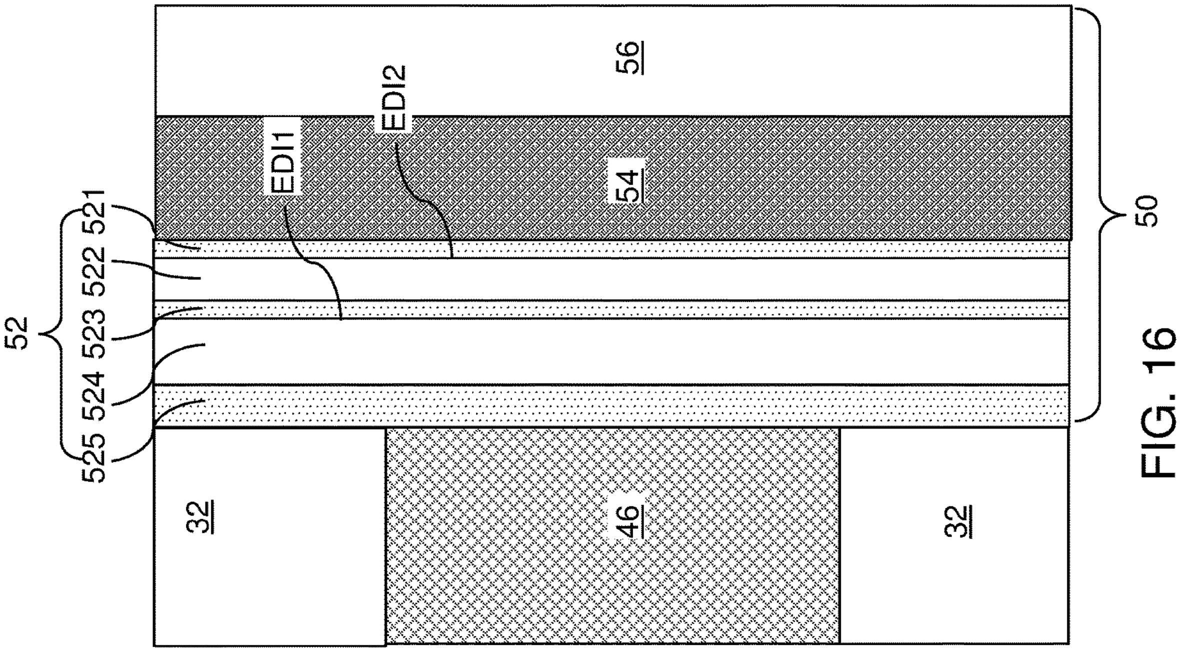
FIG. 16 is a vertical cross-sectional view of a portion of the first exemplary structure illustrating the blocking dielectric film according to the first embodiment of the present disclosure.

Referring to FIG. 16, a region of the first configuration of the exemplary structure is illustrated about an interface between an electrically conductive layer 46 and a memory opening fill structure 58 after the processing steps of FIG. 15. In the first configuration of the exemplary structure, the electrically conductive layers 46 are formed directly on physically exposed cylindrical surface segments of each blocking dielectric film 52, which has the first configuration illustrated in FIG. 6. The blocking dielectric film 52 includes, from a side that is proximal to the vertical stack of memory elements toward a side that is distal from the vertical stack of memory elements, an inner dielectric metal oxide blocking dielectric layer 521, an inner silicon oxide blocking dielectric layer 522, a middle dielectric metal oxide blocking dielectric layer 523, an outer silicon oxide blocking dielectric layer 524, and an outer dielectric metal oxide blocking dielectric layer 525.

Figure 17:
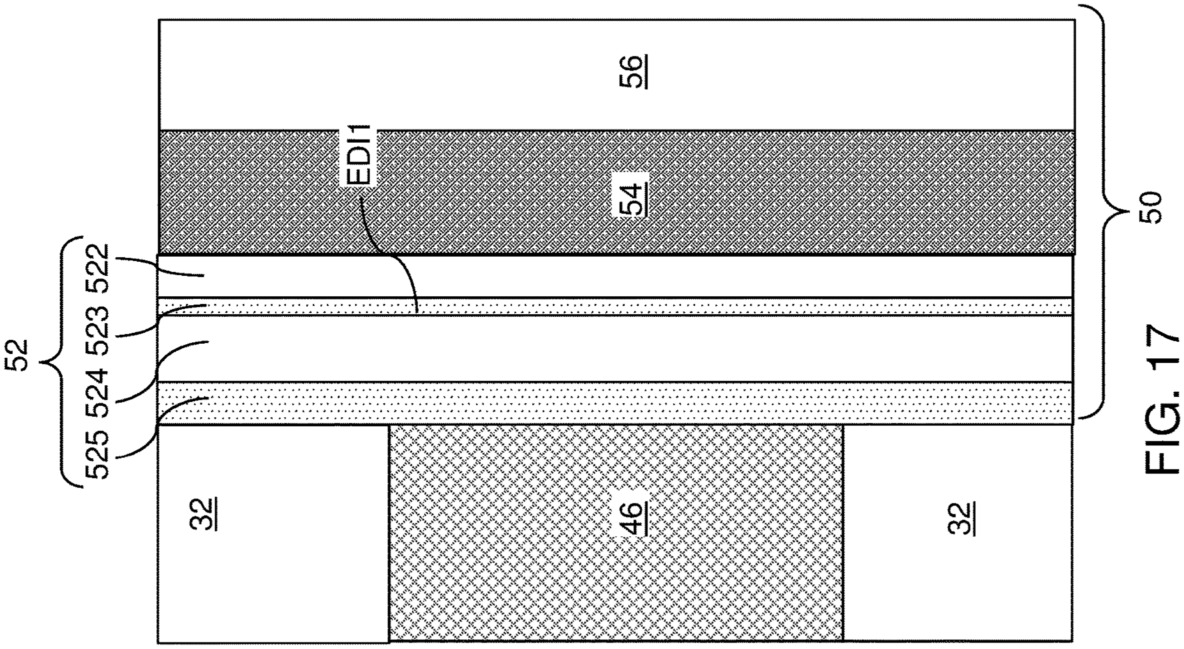
FIG. 17 is a vertical cross-sectional view of a portion of the second exemplary structure illustrating the blocking dielectric film according to the second embodiment of the present disclosure.

Referring to FIG. 17, a region of the second configuration of the exemplary structure is illustrated about an interface between an electrically conductive layer 46 and a memory opening fill structure 58 after the processing steps of FIG. 15. The electrically conductive layers 46 are formed directly on physically exposed cylindrical surface segments of each blocking dielectric film 52, which has the second configuration illustrated in FIG. 7. The blocking dielectric film 52 includes, from a side that is proximal to the vertical stack of memory elements toward a side that is distal from the vertical stack of memory elements, an inner silicon oxide blocking dielectric layer 522, a middle dielectric metal oxide blocking dielectric layer 523, an outer silicon oxide blocking dielectric layer 524, and an outer dielectric metal oxide blocking dielectric layer 525.

In some embodiments, the blocking dielectric film 52 has a cylindrical configuration within the memory opening 49. In one embodiment, a first electric dipole interface EDI1 is present between the outer silicon oxide blocking dielectric layer 524 and the middle dielectric metal oxide blocking dielectric layer 523, the first electric dipole interface EDI1 having a dipole moment pointing from the outer silicon oxide blocking dielectric layer 524 toward the middle dielectric metal oxide blocking dielectric layer 523.

In one embodiment, the middle dielectric metal oxide blocking dielectric layer 523 has a higher atomic density of oxygen atoms than the outer silicon oxide blocking dielectric layer 524. In one embodiment, a surface portion of the middle dielectric metal oxide blocking dielectric layer 523 that is proximal to the outer silicon oxide blocking dielectric layer 524 comprises oxygen vacancies at a higher vacancy concentration than a surface portion of the outer silicon oxide blocking dielectric layer 524 that is proximal to the middle dielectric metal oxide blocking dielectric layer 523.

In one embodiment, the middle dielectric metal oxide blocking dielectric layer 523 consists essentially of aluminum oxide. In one embodiment, the middle dielectric metal oxide blocking dielectric layer 523 has a thickness that is less than one half of a thickness of the inner silicon oxide blocking dielectric layer 522, and is less than one half of a thickness of the outer silicon oxide blocking dielectric layer 524. In one embodiment, the outer dielectric metal oxide blocking dielectric layer 525 consists essentially of aluminum oxide.

In one embodiment, the vertical stack of memory elements comprises portions of a charge storage layer (e.g., the memory material layer 54) that vertically extends continuously through a plurality of electrically conductive layers 46 within the alternating stack (32, 46). In one embodiment, the inner silicon oxide blocking dielectric layer 522 is in contact with an outer sidewall of the charge storage layer.

In one embodiment, the blocking dielectric film 52 further comprises an inner dielectric metal oxide blocking dielectric layer 521 that contacts an inner sidewall of the inner silicon oxide blocking dielectric layer 522 and an outer sidewall of the charge storage layer. In one embodiment, a second electric dipole interface EDI2 is present between the inner silicon oxide blocking dielectric layer 522 and the first electric dipole interface EDI1, the second electric dipole interface EDI2 having a dipole moment pointing from the inner silicon oxide blocking dielectric layer 522 toward the first electric dipole interface EDI1. In one embodiment, the inner dielectric metal oxide blocking dielectric layer 521 consists essentially of aluminum oxide.

Figure 18A:
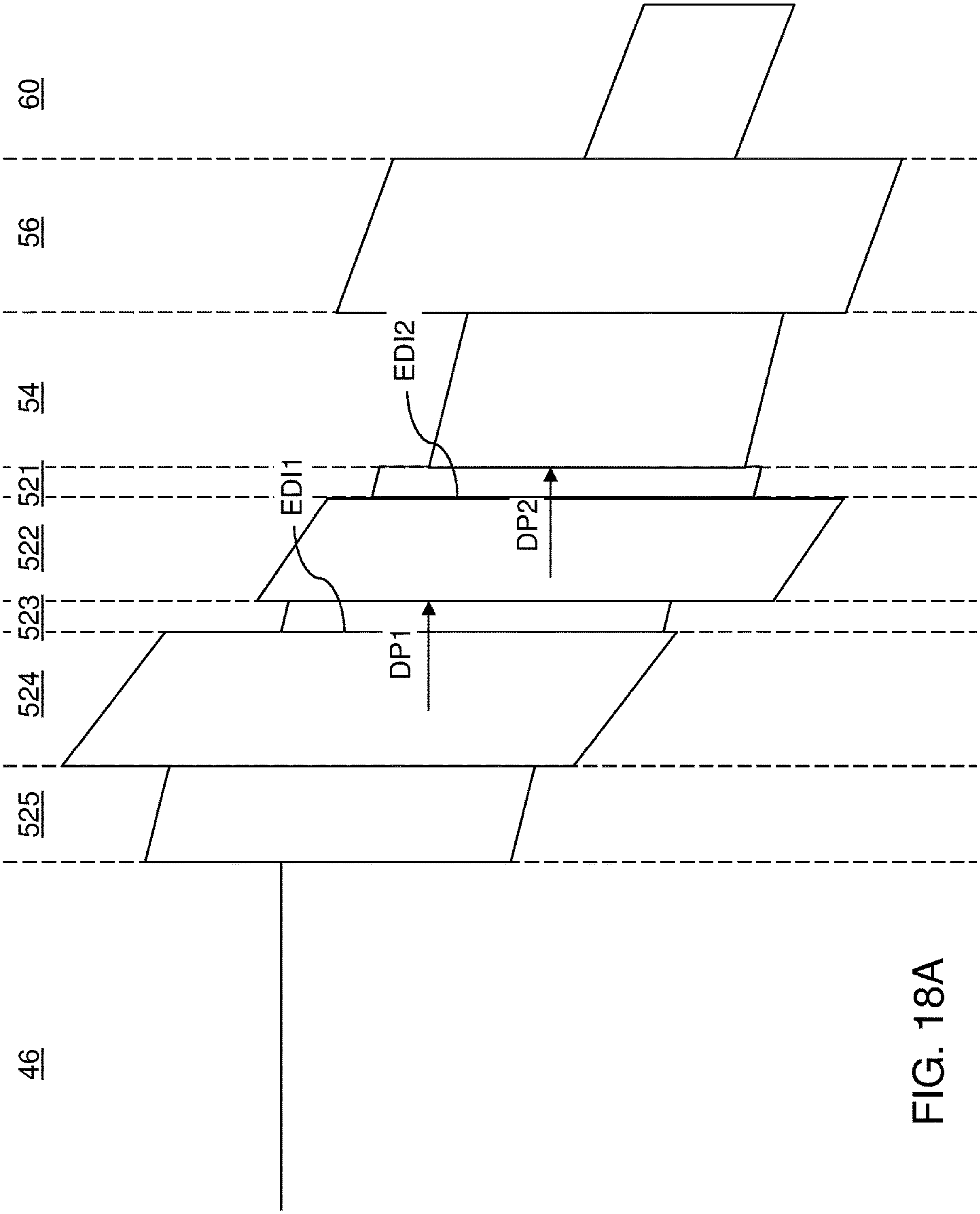
FIG. 18A is a first exemplary band diagram of a region around a memory cell of the first embodiment of the present disclosure during an erase operation.

FIG. 18A is a first exemplary band diagram of a region around a memory cell of a first embodiment of the present disclosure during an erase operation. In this case, the outer dielectric metal oxide blocking dielectric layer 525 consists of aluminum oxide; the middle dielectric metal oxide blocking dielectric layer 523 consists of aluminum oxide; and the inner dielectric metal oxide blocking dielectric layer 521 consists of aluminum oxide. The memory material layer 54 consists of silicon nitride. The dielectric material liner 56 functions as a tunneling dielectric layer and consists of silicon oxide. The vertical semiconductor channel 60 consists of polycrystalline silicon.

Figure 18B:
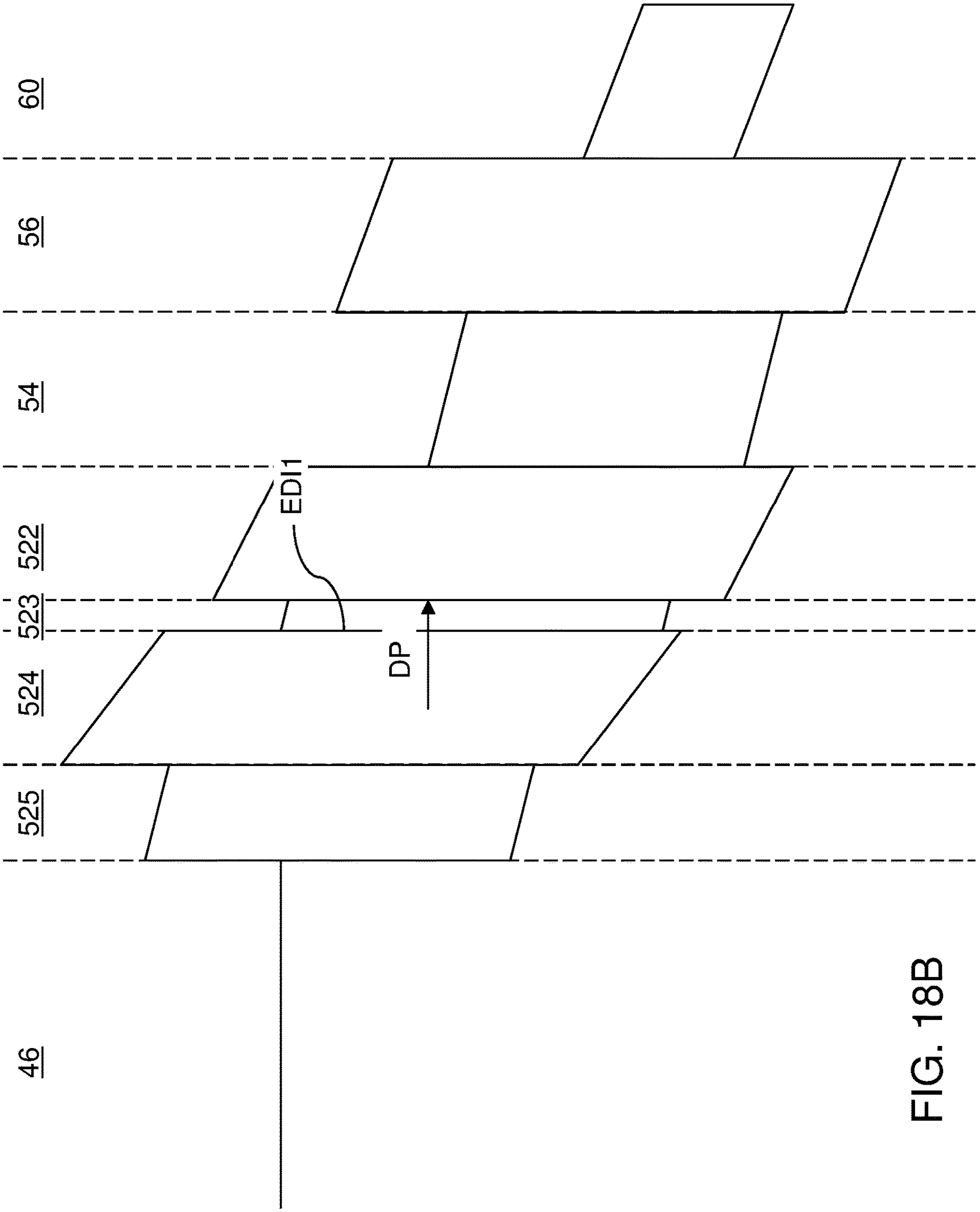
FIG. 18B is second exemplary band diagram of a region around a memory cell of the second embodiment of the present disclosure during an erase operation.

FIG. 18B is second exemplary band diagram of a region around a memory cell of the second embodiment of the present disclosure during an erase operation. In this case, the outer dielectric metal oxide blocking dielectric layer 525 consists of aluminum oxide, and the middle dielectric metal oxide blocking dielectric layer 523 consists of aluminum oxide. The memory material layer 54 consists of silicon nitride. The dielectric material liner 56 functions as a tunneling dielectric layer and consists of silicon oxide. The vertical semiconductor channel 60 consists of polycrystalline silicon.

Figure 18C:
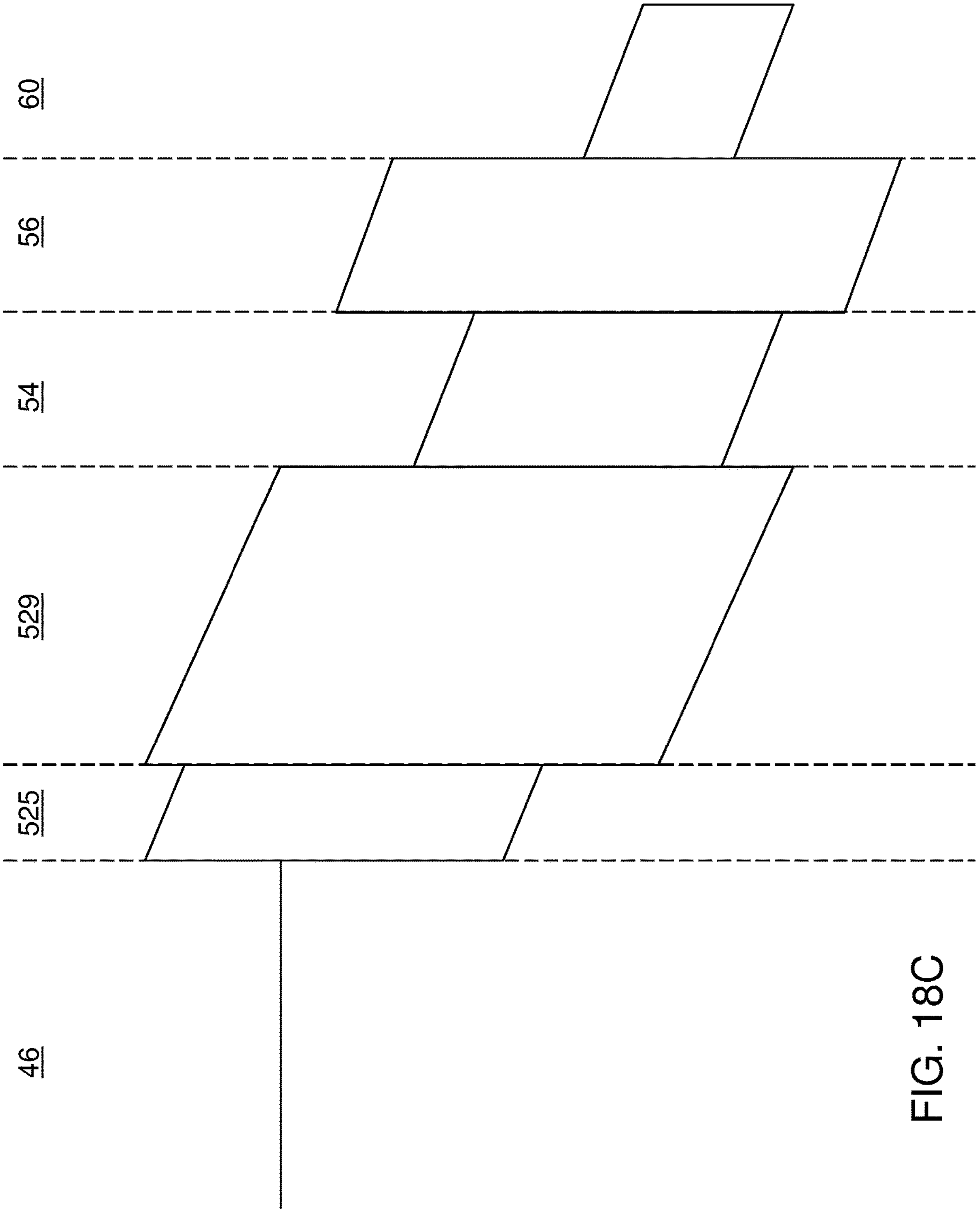
FIG. 18C is a band diagram of a region around a comparative exemplary memory cell during an erase operation.

FIG. 18C is a band diagram of a region around a comparative exemplary memory cell during an erase operation. In this case, an outer dielectric metal oxide blocking dielectric layer 525 consists of aluminum oxide, and a blocking dielectric film 529 consists of silicon oxide. The memory material layer 54 consists of silicon nitride. The dielectric material liner 56 functions as a tunneling dielectric layer and consists of silicon oxide. The vertical semiconductor channel 60 consists of polycrystalline silicon.

Comparison of the band diagrams of FIGS. 18A, 18B, and 18C shows that the presence of the first electric dipole interface EDI1 caused by first dipole moments DP1 and/or the presence of the second electric dipole interface EDI2 caused by second dipole moments DP2 within the structures of embodiments of the present disclosure (as shown in FIGS. 18A and 18B) effectively increases the energy barrier for tunneling of electrons from the electrically conductive layer 46 into the charge storage layer (e.g., the memory material layer 54) during an erase operation. Thus, the memory cells according to embodiments of the present disclosure, such as the first embodiment for example, have an improved erase saturation and have an are more resistant to undesirable charge tunneling from the backside, i.e., from the electrically conductive layers 46. The presence of the first electric dipole interface EDI1 caused by first dipole moments DP1 and/or the presence of the second electric dipole interface EDI2 caused by second dipole moments DP2 within the structures of embodiments of the present disclosure also suppresses unwanted charge tunneling between the charge storage layer and the electrically conductive layers 46 during a programming operation as well.

According to an aspect of the present disclosure, when a dielectric metal oxide material (such as aluminum oxide) and a silicon oxide material come into contact with each other, oxygen ion may move from the dielectric metal oxide material into the silicon oxide material due to the differences in the oxygen atomic density in the two dielectric materials. Negative charges may accumulate on the silicon oxide side of the interface, and positive charges may accumulate on the dielectric metal oxide material of the interface, thereby forming dipole moments. By inserting a layer of the dielectric metal oxide material (such as the middle dielectric metal oxide blocking dielectric layer 523 and/or the inner dielectric metal oxide blocking dielectric layer 521) between a silicon oxide layer (such as the outer silicon oxide blocking dielectric layer 524 and/or the inner silicon oxide blocking dielectric layer 522) and a charge storage layer (such as a silicon nitride layer), charge pairs are formed at an interface between the layer of the dielectric metal oxide material and the silicon oxide layer. The negative charges in a surface region of the silicon oxide layer locally raise the conduction band of a region of the silicon oxide layer proximate to the interface, and the positive charges in a surface region of the layer of the dielectric metal oxide locally lower the conduction band in the layer of the dielectric metal oxide proximate to the interface. This local band offset reduces electron tunneling between the charge storage layer and the electrically conductive layers 46 during the programming operations, and thus, improves programming efficiency of the device.

Generally, as a charge storage layer becomes thinner, the efficiency of electron capture during a programming operation decreases, and the program slope during a programming operation degrades. However, the range of threshold voltage distribution decreases as the effect of nearest-word-line interference decreases, and the programming voltage window for a programming operation increases. Further, fresh data retention time increases as a thinner charge storage layer decreases electron lateral diffusion through traps.

Given the above considerations, the introduction of one or both electric dipole interfaces (EDI1, EDI2) of the embodiments of present disclosure, especially when combined with reduction in the thickness of a charge storage layer, is expected to reduce the threshold voltage distribution and to increase fresh date retention without degrading the program slope.

Furthermore, the device of the second embodiment is configured to improve the fresh data retention and fresh PD budget (e.g., threshold voltage distribution width). Without wishing to be bound by a particular theory, it is believed that the structure of the second embodiment reduces undesired aluminum diffusion and electron trap site generation, which decreases electron lateral diffusion via these traps, while maintaining the advantages of the combination of dipole and thinner charger storage layer. Furthermore, the device of the second embodiment may also improve erase saturation improvement.

Figure 19:
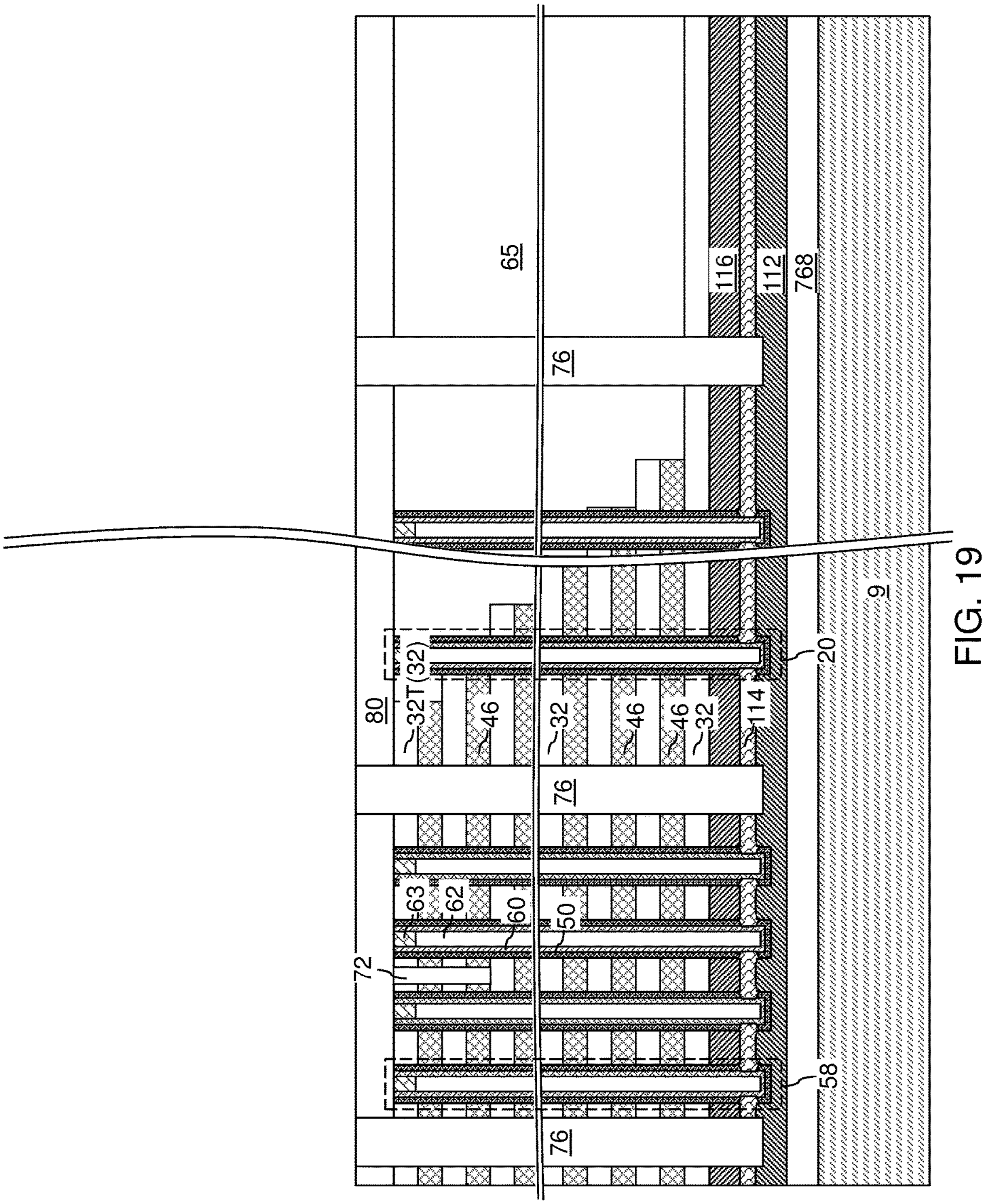
FIG. 19 is a schematic vertical cross-sectional view of the exemplary structure after formation of trench fill dielectric structures according to an embodiment of the present disclosure.

Referring to FIG. 19, a dielectric fill material such as silicon oxide can be deposited in the through-stack trenches 79. A recess etch process can be performed to remove portions of the dielectric fill material that are deposited over the contact-level dielectric layer 80. Remaining portions of the dielectric fill material that fill the through-stack trenches 79 constitute trench dielectric fill structures 76.

Figure 20:
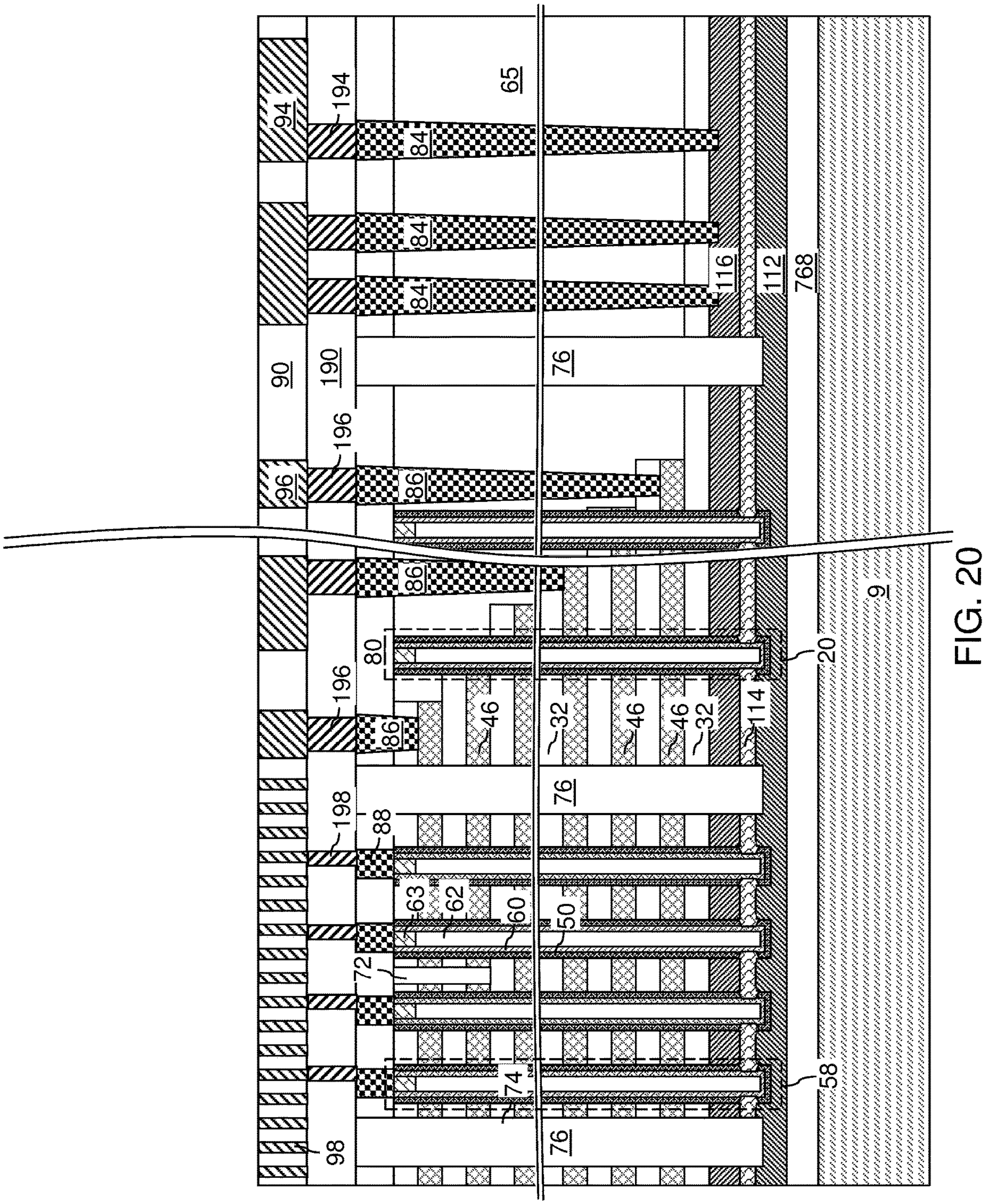
FIG. 20 is a schematic vertical cross-sectional view of the exemplary structure after formation of additional contact via structures, connection via structures, and bit-line-level metal lines according to an embodiment of the present disclosure.

Referring to FIG. 20, various via cavities can be formed through the contact-level dielectric layer 80 and the stepped dielectric material portion 65. The via cavities may comprise drain contact via cavities extending down to a respective drain region 63 in the memory opening fill structures 58, layer contact via cavities extending down to a respective electrically conductive layer 46 at, or underneath, the stepped surfaces of the alternating stack (32, 46) underneath the stepped dielectric material portion 65, and connection via cavities extending down into the source-level material layers (112, 114, 116).

At least one conductive material can be deposited in each of the via cavities, and excess portions of the at least one conductive material can be removed from above the horizontal plane including the top surface of the contact-level dielectric layer 80. Each remaining portion of the at least one conductive material constitutes a via structure (88, 86, 84). The via structures (88 86, 84) comprise drain contact via structures 88 formed in the drain contact via cavities and contacting a top surface of a respective one of the drain regions 63. Thus, the drain contact via structures 88 vertically extend through the contact-level dielectric layer 80 and contact an end surface of a respective one of the memory opening fill structures 58. The via structures (88, 86, 84) further comprise layer contact via structures 86 formed in the layer contact via cavities and contacting a top surface of a respective one of the electrically conductive layers 46. The via structures (88, 86, 84) further comprise connection via structures 84 formed in the connection via cavities and extending into the source-level material layers (112, 114, 116). The connection via structures 84 are also referred to as through-memory-level connection via structures. Distal end surfaces of the drain contact via structures 88, distal end surfaces of the layer contact via structures 86, and distal end surfaces of the connection via structures 84 can be located within a same horizontal plane, such as a horizontal plane including the top surface of the contact-level dielectric layer 80.

A via-level dielectric layer 190 is formed over the contact-level dielectric layer 80. Various connection via structures (198, 196, 194) can be formed through the via-level dielectric layer 190. For example, bit line connection via structures 198 can be formed on the drain contact via structures 88, word line connection via structures 196 can be formed on the layer contact via structures 86, and peripheral extension via structures 194 can be formed on the connection via structures 84.

A first line-level dielectric layer 90 is deposited over the via-level dielectric layer 190. Various metal line structures (98, 96, 94) are formed in the first line-level dielectric layer 90. The metal line structures (98, 96, 94) are herein referred to as first line level metal interconnect structures. The various metal line structures (98, 96, 94) include bit lines 98 that are electrically connected to a respective plurality of the drain contact via structures 88 (for example, through the bit line connection via structures 198), a word-line-connection metal interconnect lines 96 that are electrically connected to a respective one of the layer contact via structures 86 (for example, through a word line connection via structure 196), and peripheral metal interconnect lines 94 that are electrically connected to a respective one of the connection via structures 94 (for example, through a peripheral extension via structure 194).

The bit lines 98 are electrically connected to upper ends of a respective subset of the vertical semiconductor channels 60 in the memory opening fill structures 58 in the memory array region 100. In one embodiment, the memory opening fill structures 58 are arranged in rows that extend along the first horizontal direction hd1, and the bit lines 98 laterally extend along the second horizontal direction hd2.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:

an alternating stack of insulating layers and electrically conductive layers arranged along a vertical direction;

a memory opening vertically extending through the alternating stack; and a memory opening fill structure located in the memory opening and comprising a vertical semiconductor channel and a memory film, wherein:

the memory film comprises a blocking dielectric film, a tunneling dielectric layer and a vertical stack of memory elements located between the blocking dielectric film and the tunneling dielectric layer; and the blocking dielectric film comprises component layers which comprise, from a side that is proximal to the vertical stack of memory elements toward a side that is distal from the vertical stack of memory elements, an inner dielectric metal oxide blocking dielectric layer, an inner silicon oxide blocking dielectric layer, a middle dielectric metal oxide blocking dielectric layer, an outer silicon oxide blocking dielectric layer, and an outer dielectric metal oxide blocking dielectric layer, wherein:

a first electric dipole interface is located between the outer silicon oxide blocking dielectric layer and the middle dielectric metal oxide blocking dielectric layer, and has a first dipole moment pointing inward from the outer silicon oxide blocking dielectric layer toward the middle dielectric metal oxide blocking dielectric layer; and a second electric dipole interface is located between the inner silicon oxide blocking dielectric layer and the inner dielectric metal oxide blocking dielectric layer, and has a second dipole moment pointing inward from the inner silicon oxide blocking toward the inner dielectric metal oxide blocking dielectric layer.

2. The memory device of claim 1, wherein the middle dielectric metal oxide blocking dielectric layer has a higher atomic density of oxygen atoms than the outer silicon oxide blocking dielectric layer.

3. The memory device of claim 2, wherein a surface portion of the middle dielectric metal oxide blocking dielectric layer that is proximal to the outer silicon oxide blocking dielectric layer comprises oxygen vacancies at a higher vacancy concentration than a surface portion of the outer silicon oxide blocking dielectric layer that is proximal to the middle dielectric metal oxide blocking dielectric layer.

4. The memory device of claim 1, wherein the middle dielectric metal oxide blocking dielectric layer consists essentially of aluminum oxide.

5. The memory device of claim 1, wherein the middle dielectric metal oxide blocking dielectric layer has a thickness that is less than one half of a thickness of the inner silicon oxide blocking dielectric layer, and is less than one half of a thickness of the outer silicon oxide blocking dielectric layer.

6. The memory device of claim 1, wherein the outer dielectric metal oxide blocking dielectric layer consists essentially of aluminum oxide.

7. The memory device of claim 1, wherein the vertical stack of memory elements comprises portions of a charge storage layer that vertically extends continuously through the alternating stack.

8. The memory device of claim 7, wherein the inner dielectric metal oxide blocking dielectric layer contacts an outer sidewall of the charge storage layer.

9. The memory device of claim 8, wherein the inner dielectric metal oxide blocking dielectric layer consists essentially of aluminum oxide.

* * * * *